United States Patent
Li

(10) Patent No.: US 11,764,327 B2
(45) Date of Patent: Sep. 19, 2023

(54) LIGHT EMITTING DIODE WITH A GRADED QUANTUM BARRIER LAYER

(71) Applicant: KING ABDULLAH UNIVERSITY OF SCIENCE AND TECHNOLOGY, Thuwal (SA)

(72) Inventor: Xiaohang Li, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 80 days.

(21) Appl. No.: 17/054,209

(22) PCT Filed: Jun. 6, 2019

(86) PCT No.: PCT/IB2019/054821
§ 371 (c)(1),
(2) Date: Nov. 10, 2020

(87) PCT Pub. No.: WO2019/239289
PCT Pub. Date: Dec. 19, 2019

(65) Prior Publication Data
US 2021/0074875 A1 Mar. 11, 2021

Related U.S. Application Data

(60) Provisional application No. 62/684,283, filed on Jun. 13, 2018.

(51) Int. Cl.
*H01L 33/00* (2010.01)
*H01L 33/06* (2010.01)
(Continued)

(52) U.S. Cl.
CPC ...... *H01L 33/0025* (2013.01); *H01L 33/0075* (2013.01); *H01L 33/06* (2013.01);
(Continued)

(58) Field of Classification Search
CPC ..... H01L 33/14; H01L 33/06; H01L 33/0025; H01L 33/025; H01L 33/0075; H01L 33/145; H01L 33/32
See application file for complete search history.

(56) References Cited

U.S. PATENT DOCUMENTS

| 6,724,013 B2* | 4/2004 | Kneissl | B82Y 20/00 |
| | | | 257/14 |
| 7,098,482 B2* | 8/2006 | Cho | H01L 33/08 |
| | | | 257/86 |

(Continued)

FOREIGN PATENT DOCUMENTS

| EP | 1280212 A2 | 1/2003 |
| EP | 2348548 A2 | 7/2011 |
| WO | 2007089360 A2 | 8/2007 |

OTHER PUBLICATIONS

Chen, S., et al., "Numerical Analysis on the Effects of Multi-Quantum Last Barriers in AlGaN-Based Ultraviolet Light-Emitting Diodes," Applied Physics A, Nov. 30, 2014, Vo. 118, pp. 1357-1363, Springer-Verlag Berlin Heidelberg.

(Continued)

*Primary Examiner* — Savitri Mulpuri
(74) *Attorney, Agent, or Firm* — PATENT PORTFOLIO BUILDERS PLLC

(57) ABSTRACT

A light-emitting diode includes an n-type aluminum nitride layer formed on a substrate, a multiple quantum well formed on the n-type aluminum nitride layer, and a p-type aluminum nitride hole-injection layer formed adjacent to the multiple quantum well. The multiple quantum well includes a first aluminum nitride quantum well layer having a fixed composition and surrounded by first and second aluminum nitride quantum barrier layers, and a second aluminum nitride quantum well layer having a fixed composition and surrounded by the second aluminum nitride quantum barrier (Continued)

layer and a third aluminum nitride quantum barrier layer. At least one of the first, second, and third aluminum nitride quantum barrier layers has a graded aluminum composition. The first aluminum nitride quantum barrier layer is adjacent to the n-type aluminum nitride layer and the third aluminum nitride quantum barrier layer is adjacent to the p-type aluminum nitride hole-injection layer.

11 Claims, 19 Drawing Sheets

(51) Int. Cl.
   *H01L 33/14* (2010.01)
   *H01L 33/32* (2010.01)
(52) U.S. Cl.
   CPC ............ *H01L 33/14* (2013.01); *H01L 33/145* (2013.01); *H01L 33/32* (2013.01)

(56) References Cited

U.S. PATENT DOCUMENTS

| 7,705,344 | B2* | 4/2010 | Lin | ............... | H01L 33/025 257/79 |
|---|---|---|---|---|---|
| 2002/0145147 | A1* | 10/2002 | Chiou | ............... | H01L 33/10 257/E33.068 |
| 2007/0181869 | A1* | 8/2007 | Gaska | ............... | H01L 33/06 257/14 |
| 2009/0236586 | A1* | 9/2009 | Chen | ............... | B82Y 20/00 257/15 |
| 2011/0198561 | A1 | 8/2011 | Tachibana et al. | | |
| 2014/0332754 | A1 | 11/2014 | Zhang | | |
| 2015/0144874 | A1* | 5/2015 | Park | ............... | H01L 33/06 257/13 |

OTHER PUBLICATIONS

Fiorentini, V., "Evidence for Nonlinear Macroscopic Polarization in III-V Nitride Alloy Heterostructures," Applied Physics Letters, Feb. 18, 2002, vol. 80, No. 7, pp. 1204-1206, American Institute of Physics.

Hirayama, H., et al., "Recent Progress and Future Prospects of AlGaN-Based High-Efficiency Deep Ultraviolet Light-Emitting Diodes," Japanese Journal of Applied Physics, 2014, Vo. 53, pp. 100209-1-100209-10, The Japan Society of Applied Physics.

International Search Report in corresponding/related International Application No. PCT/IB2019/054821, dated Sep. 4, 2019.

Khan, A., et al., "Ultraviolet Light-Emitting Diodes Based on Group Three Nitrides," Nature Photonics, Feb. 2008, vol. 2, pp. 77-84, Nature Publishing Group.

Li, J., et al., "Optical and Electrical Properties of Mg-doped p-type $Al_xGa1-xN$," Applied Physics Letters, Feb. 18, 2002, vol. 80, No. 7, pp. 1210-1212, American Institute fof Physics.

Lu, L., et al., "Performance Improvement of AlGaN-Based Deep-Ultraviolet Light-Emitting Diodes via Al-Composition Graded Quantum Wells," Superlattices and Microstructures, Apr. 6, 2018, Vo. 118, pp. 55-60, Elsevier Ltd.

Punya, A., et al., "Valence Band Effective-Mass Hamiltonians for the Group-III Nitrides from Quasiparticle Self-Consistent GW Band Structures," Physical Review B, May 29, 2012, vol. 85, 195147, 9 pages.

Written Opinion of the International Searching Authority in corresponding/related International Application No. PCT/IB2019/054821, dated Sep. 4, 2019.

* cited by examiner

LIGHT EMITTING DIODE WITH A GRADED QUANTUM BARRIER LAYER

CROSS-REFERENCE TO RELATED APPLICATIONS

This application is a U.S. National Stage Application of International Application No. PCT/IB2019/054821, filed on Jun. 10, 2019, which claims priority to U.S. Provisional Patent Application No. 62/684,283, filed on Jun. 13, 2018, entitled "REMOVAL OF ELECTRON BLOCKING LAYER BY GRADING QUANTUM BARRIER IN MULTIPLE QUANTUM WELLS FOR LIGHT EMITTING DEVICES," the disclosures of which are incorporated herein by reference in their entirety.

BACKGROUND

Technical Field

Embodiments of the subject matter disclosed herein generally relate to a light emitting diode having a multiple quantum well with quantum well layers having a fixed aluminum composition and at least one quantum barrier layer having a graded aluminum composition.

Discussion of the Background

Deep ultraviolet light sources are used in numerous important applications including water and air purification, biological analysis, medical sensors, and curing. Compared to the most widely used mercury-based deep ultraviolet sources, AlGaN-based semiconductor deep ultraviolet light emitting diodes (light emitting diodes) are environment-friendly, compact, and long-lasting. However, unlike the highly efficient blue light emitting diodes, deep ultraviolet light emitting diodes still suffer from single-digit wall plug efficiency (WPE) even though the highest external quantum efficiency (EQE) is over 20%. The use of an electron blocking layer (EBL) is a significant constraint on wall plug efficiency. In III-nitride light emitting diodes, electrons have much higher mobility than holes and thus the electrons tend to flow over the active region, typically comprising multiple quantum wells (MQWs), into the p-type region. These overflown electrons do not participate in radiative recombination in the active region and are wasted. Moreover, the overflown electrons can recombine with holes in the p-type region, which reduces hole injection efficiency. Thus, electron overflow is one major contributing factors to lower wall plug efficiency.

To address the electron overflow, the electron blocking layer, which is commonly a wider-bandgap and higher-Al-composition layer or structure, has typically been employed between the p-type region and the active region. However, the electron blocking layer can hinder hole injection and increase serial resistance constraining the wall plug efficiency due to two intrinsic material properties. First, the band alignment determines that the heterojunctions formed by InAlGaN alloys are type-I (straddling gap), which indicates that the desirable conduction band barrier of the electron blocking layer blocking electrons on the active region side also leads to simultaneous formation of a valence band barrier blocking holes on the p-type region side, thereby impeding hole injection. Second, excellent p-type doping is necessary for the electron blocking layer to achieve low layer resistance. However, the activation energy of the Mg acceptor in III-nitride layers increases rapidly with the Al composition, which makes the p-doping challenging for Al-rich III-nitride layers such as AlGaN. In state-of-the-art deep ultraviolet light emitting diodes emitting at technically-important wavelength range of 225-280 nm, the Al compositions of the p-type AlGaN electron blocking layers can be up to 95%, posing major challenges for the p-doping. Accordingly, the higher Al compositions can lead to lower hole injection efficiency in the active region and more challenging Mg activation in the electron blocking layer, which are both negative for wall plug efficiency improvement. Because of the technical importance of the deep ultraviolet light emitting diode, both issues of the electron blocking layer have attracted enormous interest and attention.

To address the valence band barrier issue, some researchers have employed an AlGaN/AlGaN superlattice electron blocking layer to modify the energy band to facilitate hole injection to the active region. Other solutions involve a graded electron blocking layer and inverted-V-shaped graded Al-composition electron blocking layer. In addition, an electron blocking layer with a thin AlGaN insertion layer with a smaller energy bandgap has been utilized to acquire the intraband-tunneling-assisted hole injection, which can bring down the valence band barrier height of electron blocking layer as well as enhance the hole tunneling effect.

To improve the p-doping in the AlGaN electron blocking layer with higher Al compositions, researchers have proposed polarization doping to induce three-dimensional hole gas by grading the Al composition in AlGaN layer. Moreover, a p-AlGaN/AlGaN superlattice with the average composition of 60% has been demonstrated where activation energy for Mg dopants is reduced to 17 meV. In addition, Mg-delta doping and Mg—Si co-doping have been investigated. However, those approaches could possess the optical absorption problem, suffer complex epitaxial condition, or fail to decrease the valence band barrier in the electron blocking layer.

Thus, there is a need for a way to simultaneously suppress electron overflow and enhance hole injection so as to improve wall plug efficiency.

SUMMARY

According to an embodiment, there is a light-emitting diode, which includes an n-type aluminum nitride layer formed on a substrate, a multiple quantum well formed on the n-type aluminum nitride layer, and a p-type aluminum nitride hole-injection layer formed adjacent to the multiple quantum well. The multiple quantum well includes a first aluminum nitride quantum well layer having a fixed composition and surrounded by first and second aluminum nitride quantum barrier layers, and a second aluminum nitride quantum well layer having a fixed composition and surrounded by the second aluminum nitride quantum barrier layer and a third aluminum nitride quantum barrier layer. At least one of the first, second, and third aluminum nitride quantum barrier layers has a graded aluminum composition. The first aluminum nitride quantum barrier layer is adjacent to the n-type aluminum nitride layer and the third aluminum nitride quantum barrier layer is adjacent to the p-type aluminum nitride hole-injection layer.

According to another embodiment, there is a method for forming light-emitting diode. An n-type aluminum nitride layer is formed on a substrate. A multiple quantum well is formed on the n-type aluminum nitride layer, which involves forming a first aluminum nitride quantum barrier layer on the n-type aluminum nitride layer, forming a first aluminum nitride quantum well layer having a fixed composition on the first aluminum nitride quantum barrier, forming a second aluminum nitride quantum barrier layer on the first aluminum nitride quantum well layer, forming a second aluminum nitride quantum well layer having a fixed composition on the second aluminum nitride quantum barrier layer, and forming a third aluminum nitride quantum barrier layer on the second aluminum nitride quantum well layer. At least one of the first, second, and third aluminum nitride quantum barrier layers has a graded composition. A p-type aluminum nitride hole-injection layer is formed adjacent to the multiple quantum well.

According to a further embodiment, there is a multiple quantum well, which includes a first aluminum nitride quantum barrier layer, a first aluminum nitride quantum well layer having a fixed composition and arranged on the first aluminum nitride quantum barrier layer, a second aluminum nitride quantum barrier layer arranged on the first aluminum nitride quantum well layer, a second aluminum nitride quantum well layer having a fixed composition and arranged on the second aluminum nitride quantum barrier layer, and a third aluminum nitride quantum barrier layer arranged on the second aluminum nitride quantum well layer. At least one of the first, second, and third aluminum nitride quantum barrier layers has a graded aluminum composition.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of a light emitting diode.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
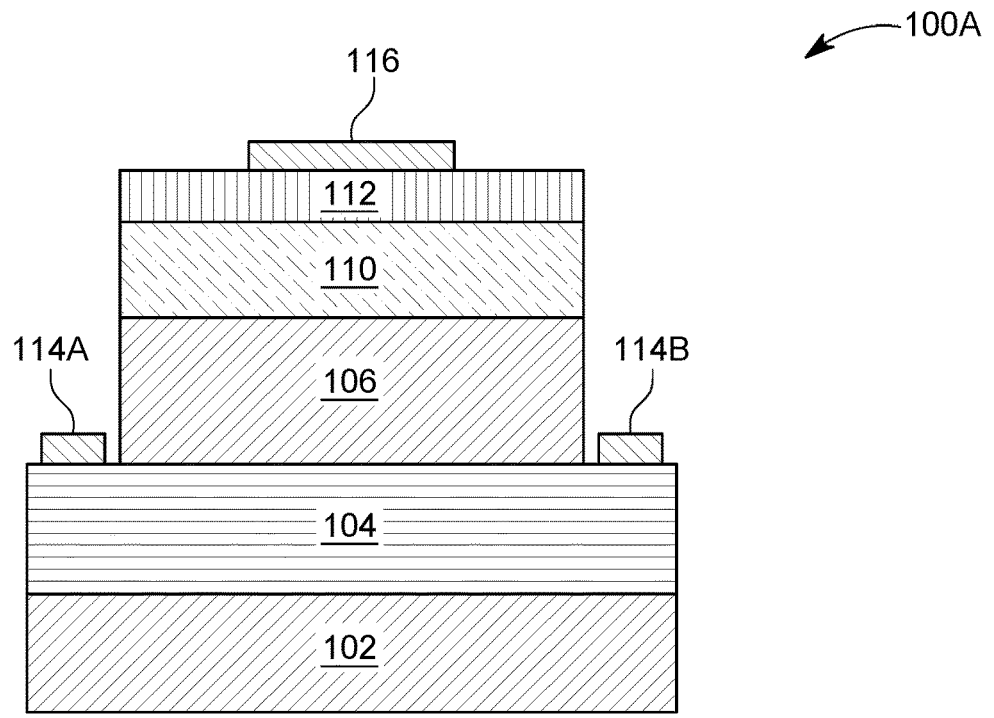
FIG. 1A is a schematic diagram of a light emitting diode according to an embodiment.
Figure 1B:
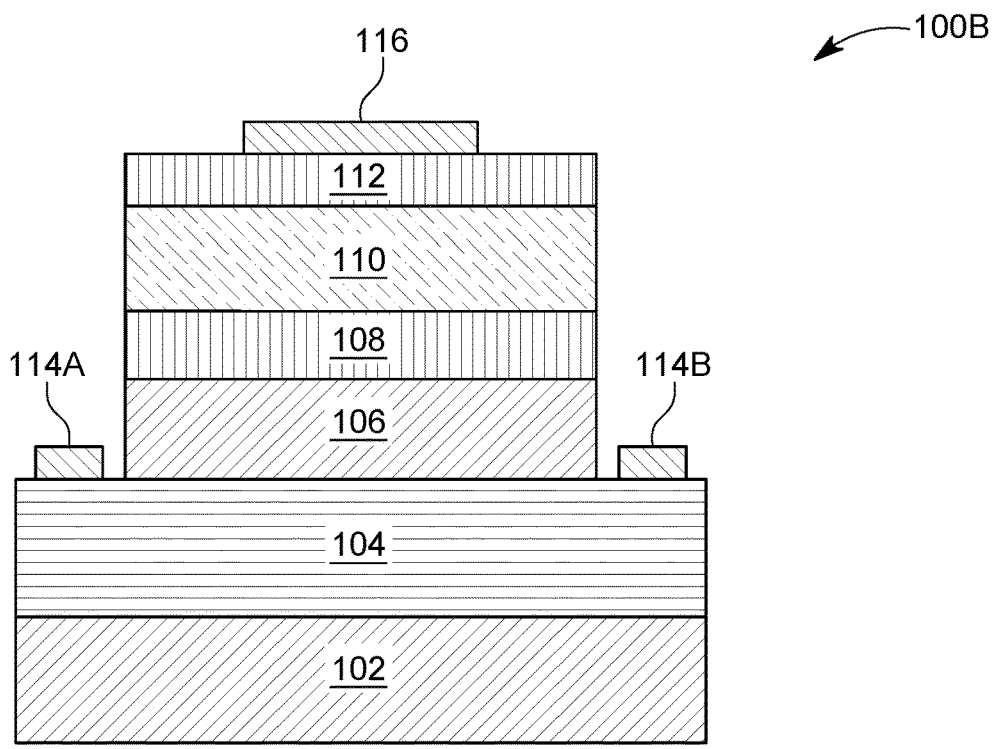
FIG. 1B is a schematic diagram of a light emitting diode according to an embodiment.

Turning first to FIGS. 1A and 1B, a light-emitting diode 100A and 100B includes a substrate 102 and an n-type aluminum nitride layer 104 formed on the substrate 102. A multiple quantum well 106 is formed on the n-type aluminum nitride layer 104. A p-type aluminum nitride hole-injection layer 110 is formed adjacent to the multiple quantum well 106.

Figure 1C:
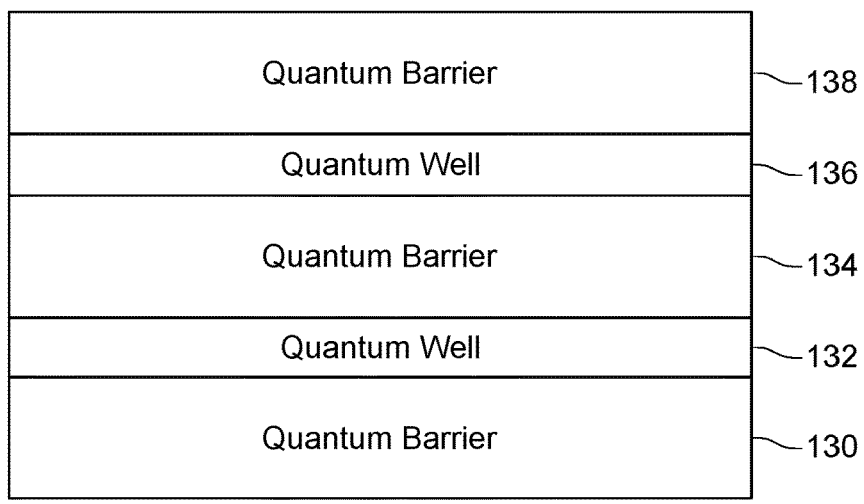
FIG. 1C is a schematic diagram of a multiple quantum well according to an embodiment.

Turning now to FIG. 1C, the multiple quantum well 106 includes a first aluminum nitride quantum well layer 132 having a fixed composition and surrounded by first 130 and second 134 aluminum nitride quantum barrier layers. The multiple quantum well 106 also includes a second aluminum nitride quantum well layer 136 having a fixed composition and surrounded by the second aluminum nitride quantum barrier layer 134 and a third aluminum nitride quantum barrier layer 138. At least one of the first 130, second 134, and third 138 aluminum nitride quantum barrier layers has a graded aluminum composition. The first aluminum nitride quantum barrier layer 130 is adjacent to the n-type aluminum nitride layer 104 and the third aluminum nitride quantum barrier layer 138 is adjacent to the p-type aluminum nitride hole-injection layer 110. In this embodiment, as well as embodiments below, at least one of the aluminum nitride quantum barrier layers has a graded aluminum composition, and thus more than one, or even all, of the aluminum nitride quantum barrier layers can have a graded composition.

Moreover, the light emitting diodes 100A and 100B include a p-type gallium nitride contact layer 112 arranged on the p-type aluminum nitride hole-injection layer 110, a first electrode 116 arranged on the p-type gallium nitride contact layer 112, and a second electrode 114A and 114B arranged on the n-type aluminum nitride layer 104. As an alternative to the p-type contact layer 112 being a gallium nitride contact layer, the p-type contact layer 112 can be an aluminum gallium nitride layer, an aluminum indium nitride layer, or an aluminum gallium indium nitride layer. The n-type aluminum nitride layer 104 can be a binary III-nitride layer consisting of aluminum and nitride, a tertiary III-nitride layer consisting of, for example, aluminum gallium nitride or aluminum indium nitride, or a quaternary III-nitride layer consisting of aluminum gallium indium nitride. Although these different types of layers are described as consisting of certain elements, it should be recognized that these layers can consist of those elements while also including insignificant concentrations of additional elements. These insignificant concentrations of additional elements can arise due to contaminants or impurities becoming part of the layer during the process of forming the layer. These contaminants or impurities typically comprise less than 0.1% of the overall composition of the layer.

As will be appreciated from the discussion above, the light emitting diodes 100A and 100B have a similar structure. The difference between these two light emitting diodes is that in the light emitting diode 100A the p-type aluminum nitride hole-injection layer 110 is directly adjacent to the multiple quantum well 106 without an intervening electron blocking layer, whereas in the light emitting diode 100B an electron blocking layer 108 is arranged between the p-type aluminum nitride hole-injection layer 110 and the multiple quantum well 106. Thus, the light emitting diode 100A does not include an electron blocking layer.

Figure 1D:
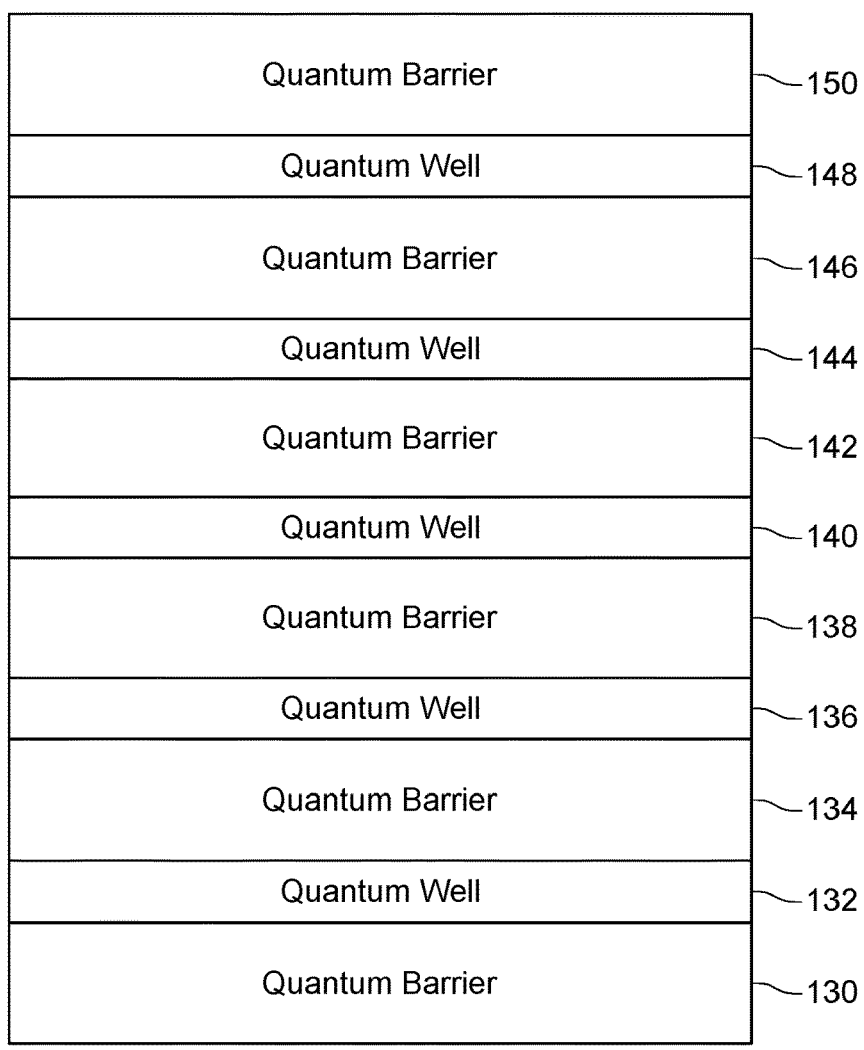
FIG. 1D is a schematic diagram of a multiple quantum well according to an embodiment.

Although the multiple quantum well illustrated in FIG. 1C includes two quantum well layers, the multiple quantum well can include more quantum well layers, an example of which is illustrated in FIG. 1D. The multiple quantum well illustrated in FIG. 1D includes five quantum well layers. In addition to the layers discussed above in connection with FIG. 1C, the multiple quantum well illustrated in FIG. 1D includes a quantum well layer 140 arranged between quantum barrier layers 138 and 142, quantum well layer 144 arranged between quantum barrier layers 142 and 146, and quantum well layer 148 arranged between quantum barrier layers 146 and 150.

In an embodiment, the various layers are ternary III-nitride layers. For example, the n-type aluminum nitride layer, first 132 and second 136 aluminum nitride quantum well layers, first 130, second 134, and third 138 aluminum nitride quantum barrier layers, and p-type aluminum nitride hole-injection layer 110 further comprise gallium. Accordingly, these layers are aluminum gallium nitride (AlGaN) layers.

In an embodiment, at least one of the aluminum nitride quantum barrier layers 130, 134, and 138 (or 130, 134, 138, 142, 146, and 150) is graded so that the amount of aluminum increases in the vertical direction in the figures so that the graded aluminum composition increases from a portion of the at least one aluminum nitride quantum barrier layers closest to the substrate 102 to a portion of the at least one aluminum nitride quantum barrier layers furthest from the substrate 102. The grading of the aluminum composition can be a linear grading or a non-linear grading (e.g., exponential, logarithmic, etc.). In an embodiment, the change in the grading across the at least one aluminum nitride quantum barrier layer in the vertical direction in the figures is a change of between two and ten percent in the amount of aluminum. Thus, when the at least one aluminum nitride quantum barrier layer also comprises gallium, as the amount of aluminum increases in the vertical direction in the figures, the amount of gallium decreases by a corresponding amount.

Figure 2A:
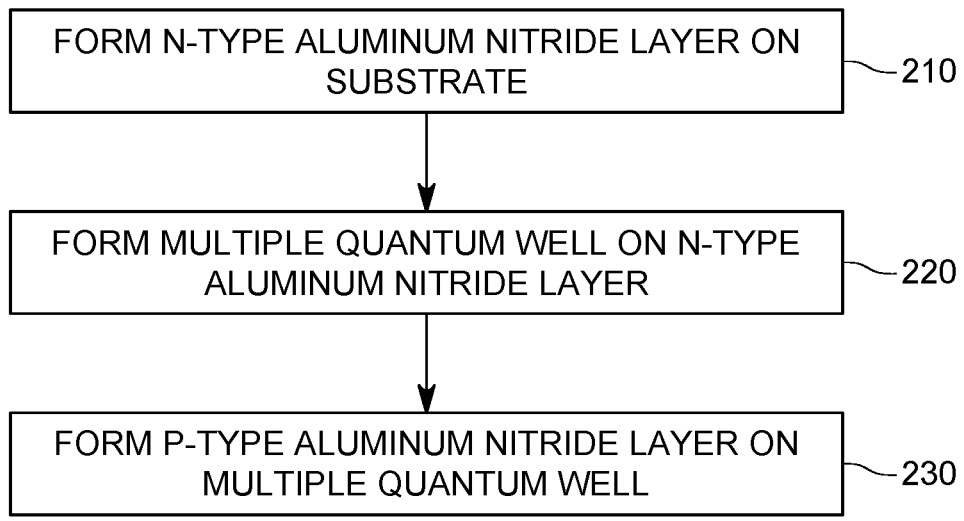
FIGS. 2A and 2B are flow diagrams of a method for forming a light emitting diode according to an embodiment.
Figure 2B:
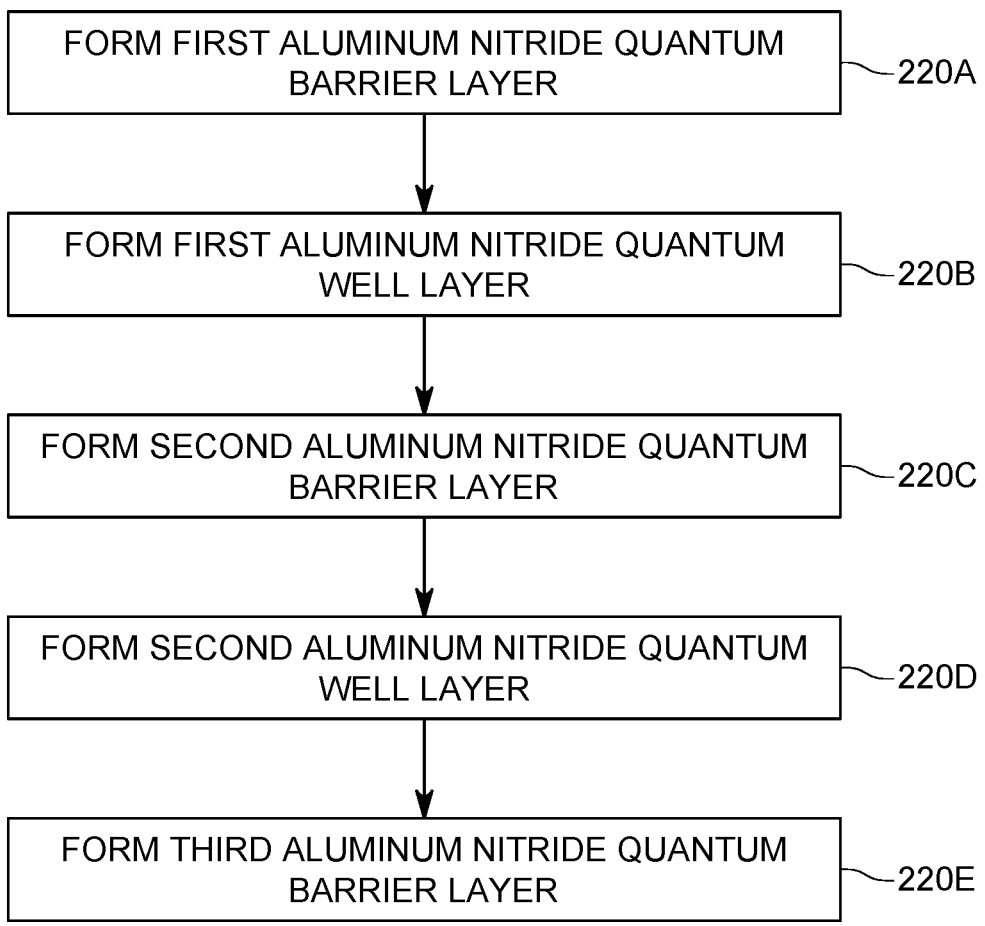

FIGS. 2A and 2B are flow diagrams of a method for forming a light emitting diode according to an embodiment. Turning first to FIG. 2A, an n-type aluminum nitride layer 104 is formed on a substrate 102 (step 210). A multiple quantum well 106 is then formed on the n-type aluminum nitride layer (step 220). Specifically, referring now to FIG. 2B, a first aluminum nitride quantum barrier layer 130 is formed on the n-type aluminum nitride layer 104 (step 220A). A first aluminum nitride quantum well layer 132 having a fixed composition is formed on the first aluminum nitride quantum barrier 130 (step 220B). A second aluminum nitride quantum barrier layer 134 is formed on the first aluminum nitride quantum well layer 132 (step 220C). A second aluminum nitride quantum well layer 136 having a fixed composition is formed on the second aluminum nitride quantum barrier layer 134 (step 220D). A third aluminum nitride quantum barrier layer 138 is formed on the second aluminum nitride quantum well layer 136 (step 220E). At least one of the first 130, second 134, and third 138 aluminum nitride quantum barrier layers has a graded composition. Returning to FIG. 2A, a p-type aluminum nitride hole-injection layer 110 is formed adjacent to the multiple quantum well 106 (step 230).

In the method above, the formation of the p-type aluminum nitride hole-injection layer 110 can involve forming the p-type aluminum nitride hole-injection layer 110 directly adjacent to the multiple quantum well 106 so that the light emitting diode 100A does not include an electron blocking layer. Alternatively, the method can further involve forming an aluminum nitride electron blocking layer 108 on the multiple quantum well 106 so that the p-type aluminum nitride hole-injection layer 110 is formed on the aluminum nitride electron blocking layer 108. The formation of at least one of the first, second, and third aluminum nitride quantum barrier layers can further involve forming the at least one the first, second and third aluminum nitride quantum barrier layers so that the graded aluminum composition increases from a portion of the at least one of first, second, and third aluminum nitride quantum barrier layers closest to the substrate to a portion of the at least one of first, second, and third aluminum nitride quantum barrier layers furthest from the substrate.

The method can also involve forming a p-type gallium nitride contact layer 112 on the p-type aluminum nitride hole-injection layer 110, forming a first electrode 116 on the p-type gallium nitride contact layer 112, and forming a second electrode 114A and 114B on the n-type aluminum nitride layer 104. The method described above can be performed using any type of epitaxial technologies, such as metal organic chemical vapor deposition (MOCVD) and molecular beam epitaxy (MBE).

In order to evaluate the effectiveness of grading the aluminum composition of the quantum barrier layers on electron containing capability, hole injection, and radiative recombination rate, three light emitting diodes, having the structure of the light emitting diode 100B illustrated in FIG. 1B, were subjected to evaluation using Advanced Physical Models of Semiconductor Devices (APSYS) software. These light emitting diodes included an aluminum nitride substrate 102, a 3 µm thick n-$Al_{0.6}Ga_{0.4}N$ layer 104 with an Si doping concentration of $5\times10^{18}$ $cm^{-3}$, a multiple quantum well 106 having five-3 nm thick $Al_{0.5}Ga_{0.5}N$ quantum well layers 132, 136, 140, 144, and 148, six-12 nm thick aluminum gallium nitride quantum barrier layers 130, 134, 138, 142, 146, and 150, a 20 nm thick p-$Al_{0.7}Ga_{0.3}N$ electron blocking layer 108 with an Mg doping concentration of $3\times10^{19}$ $cm^{-3}$, a 100 nm thick p-$Al_{0.6}Ga_{0.4}N$ layer 110 with an Mg doping concentration of $2\times10^{19}$ $cm^{-3}$, and a 20 nm thick p-GaN layer 112 with an Mg doping concentration of $1\times10^{20}$ $cm^{-3}$.

Figure 3A:
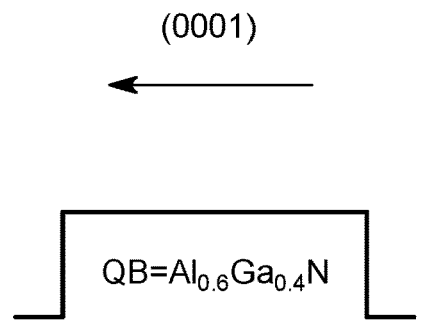
FIGS. 3A-3C illustrate aluminum composition grading of quantum barrier layers of three different light emitting diodes according to embodiments.
Figure 3B:
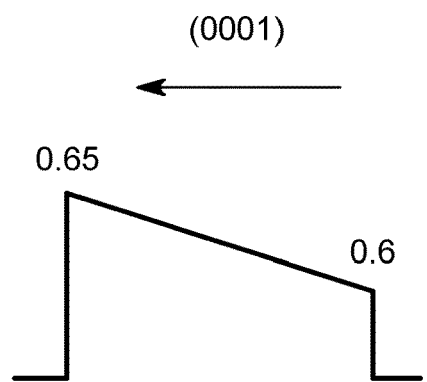
Figure 3C:
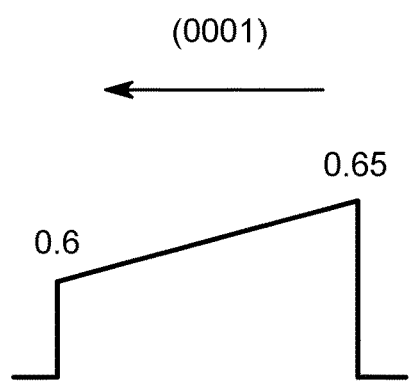

As illustrated in FIG. 3A, the first light emitting diode (hereinafter "Sample A") included an aluminum gallium nitride quantum barrier with a constant grading in the vertical direction in FIGS. 1B and 1D ("(0001)" refers to the vertical direction in FIGS. 1A-1D) and having a composition of $Al_{0.6}Ga_{0.4}N$. As illustrated in FIG. 3B, the second light emitting diode (hereinafter "Sample B") included aluminum gallium nitride quantum barrier having an aluminum composition grading that increased in the vertical direction in FIGS. 1B and 1D (hereinafter "increasing-aluminum-grading"), so that it was linearly graded from $Al_{0.6}Ga_{0.4}N$ to $Al_{0.65}Ga_{0.35}N$. As illustrated in FIG. 3C, the third light emitting diode (hereinafter "Sample C") included aluminum gallium nitride quantum barrier having an aluminum composition grading that decreased in the vertical direction in FIGS. 1B and 1D (hereinafter "decreasing-aluminum-grading"), so that it was linearly graded from $Al_{0.65}Ga_{0.35}N$ to $Al_{0.6}Ga_{0.4}N$.

The chip size of the light emitting diodes was maintained at $300\times300$ $\mu m^2$ and the emission wavelength was designed to be 270 nm, a technically-important wavelength range for sterilization, sensing, and other applications. The activation energy of n-type $Al_{0.6}Ga_{0.4}N$ layer 104 was set to 15 meV according to experimental data. The Mg activation energy of p-type $Al_{0.7}Ga_{0.3}N$ electron blocking layer 108 and the p-type $Al_{0.6}Ga_{0.4}N$ layer 110 were set to 71 meV and 60 meV, respectively. The Mg activation energy of the p-type GaN contact layer 112 was set to 118 meV based on an experimental report. However, it should be noted that the Mg activation energy of p-type GaN did not affect the trends or conclusions of this evaluation. The hole and electron mobility of AlGaN is based on previous reports and the alloy mobility model inside the APSYS software.

The Shockley-Read-Hall (SRH) recombination lifetime, the Auger recombination coefficient, the radiative recombination coefficient, and the light extraction efficiency were set to be 15 ns, $2.88\times10^{-30}$ $cm^6/s$, $2.13\times10^{-11}$ $cm^3/s$, and 10%, respectively. The bowing factor of the bandgap and the band offset ratio of AlGaN materials were set to be 0.94 and 0.67/0.33, respectively. Effective mass parameters were determined according to the Reference Document [1]. The interface charge densities were assumed to be 50% of total charges considering the screening effect of defects. The charge densities screened by injected carriers under forward bias are taken into account self-consistently.

Figure 4A:
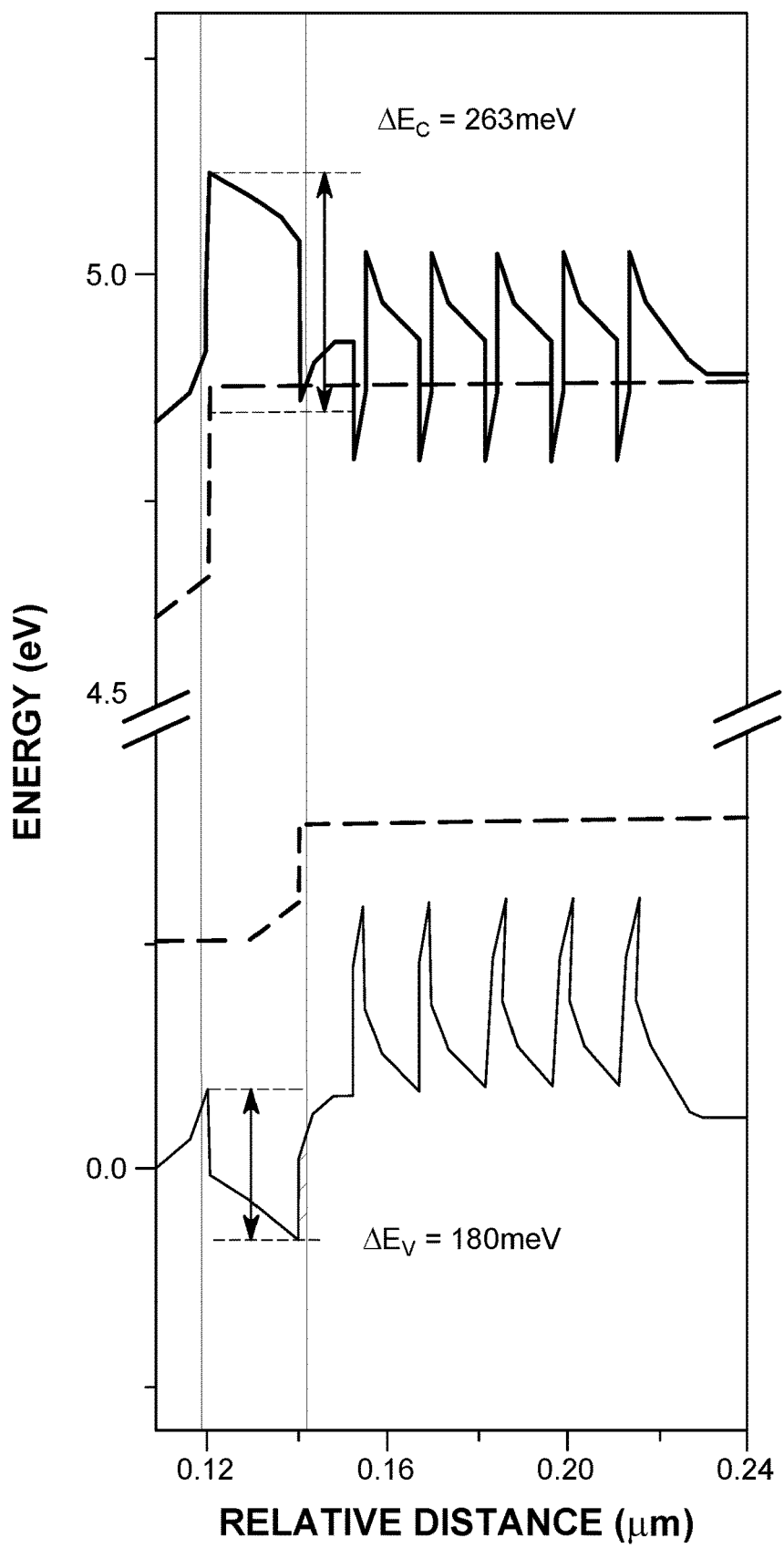
FIGS. 4A-4C are band diagrams of the active regions and electron blocking layers of three different light emitting diodes according to embodiments.
Figure 4B:
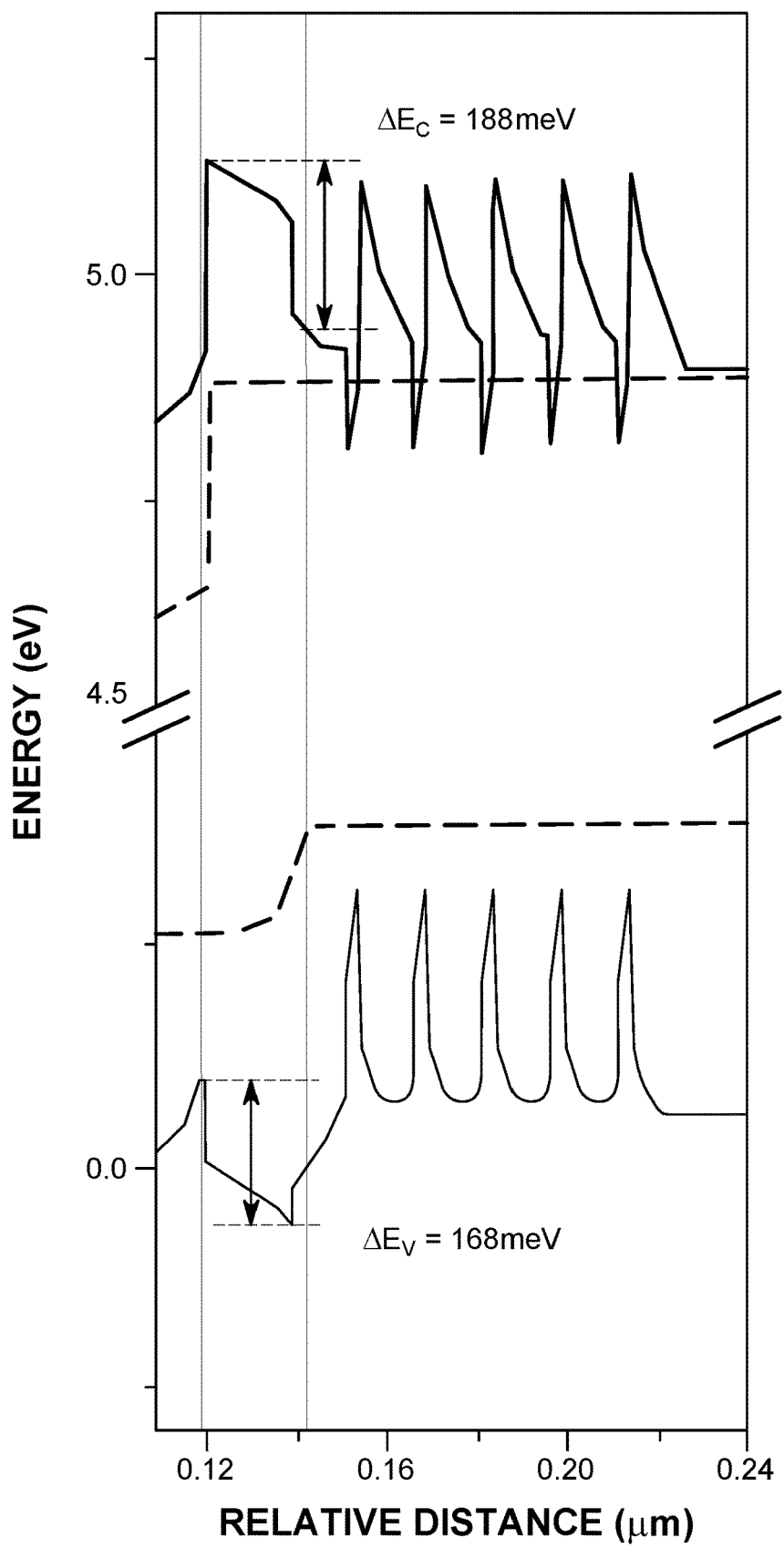
Figure 4C:
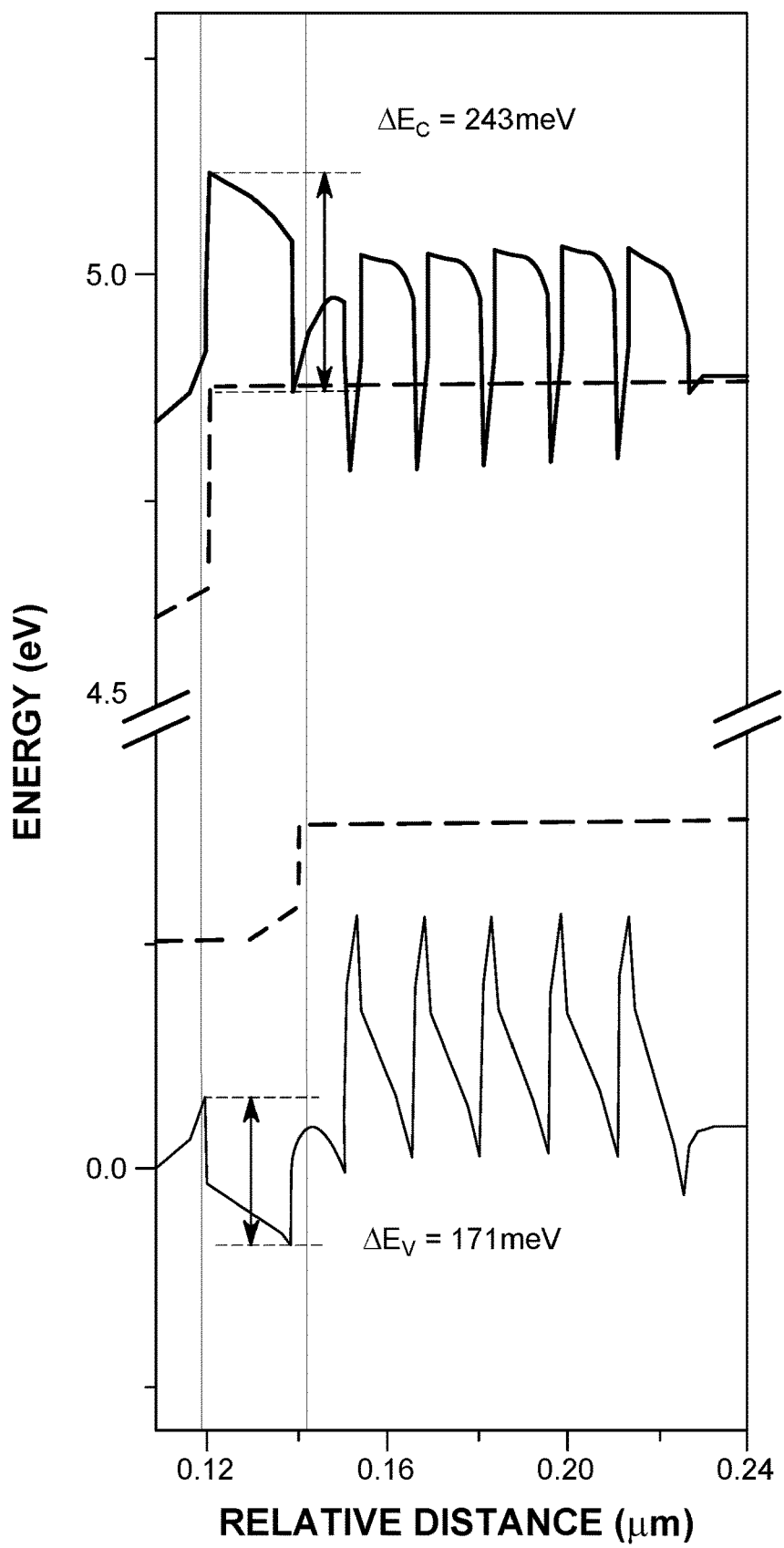

FIG. 4A-4C illustrate the band diagrams of Samples A, B, and C at 90 mA, where the gray area on the right side of the band diagrams represents the location of the electron blocking layer. As illustrated, the grading considerably impacts the slope of the conduction and valence bands of the quantum barrier. Regarding the quantum barrier conduction band, Sample B exhibited a steeper potential barrier due to the increasing-aluminum-composition grading as compared to Sample A, while Sample C exhibited flatter barrier due to compensation of existing interface charge by the decreased-aluminum-composition grading. For the quantum barrier valence band, however, Samples B and C exhibited flatter and steeper quantum valence bands, respectively, which is the opposite behavior to the quantum barrier conduction bands. In addition, the quantum barrier grading can cause considerable changes to the electron blocking layer conduction and valence band offsets $E_c$ and $E_v$ because the last quantum barrier is adjacent to the electron blocking layer. $E_c$ for electron blocking in Samples A, B, and C were 263, 188, and 243 meV, respectively. Notably, Sample B possessed the smallest $E_c$ while those of Samples A and C were similar. $E_v$ related to hole injection in Samples A, B, and C were 180, 168, 171 meV, respectively. The hole barriers of Sample B and C were slightly lower than that of Sample A. If the active regions of Samples A, B, and C were the same, one would assume that Sample B would have the largest electron overflow and Sample C would have larger hole concentration than Sample A in the quantum wells. However, this is not necessarily the case, because the slopes of the quantum barrier conduction and valence bands can strongly influence the carrier transport that is the key to the electron containing capability.

Figure 5A:
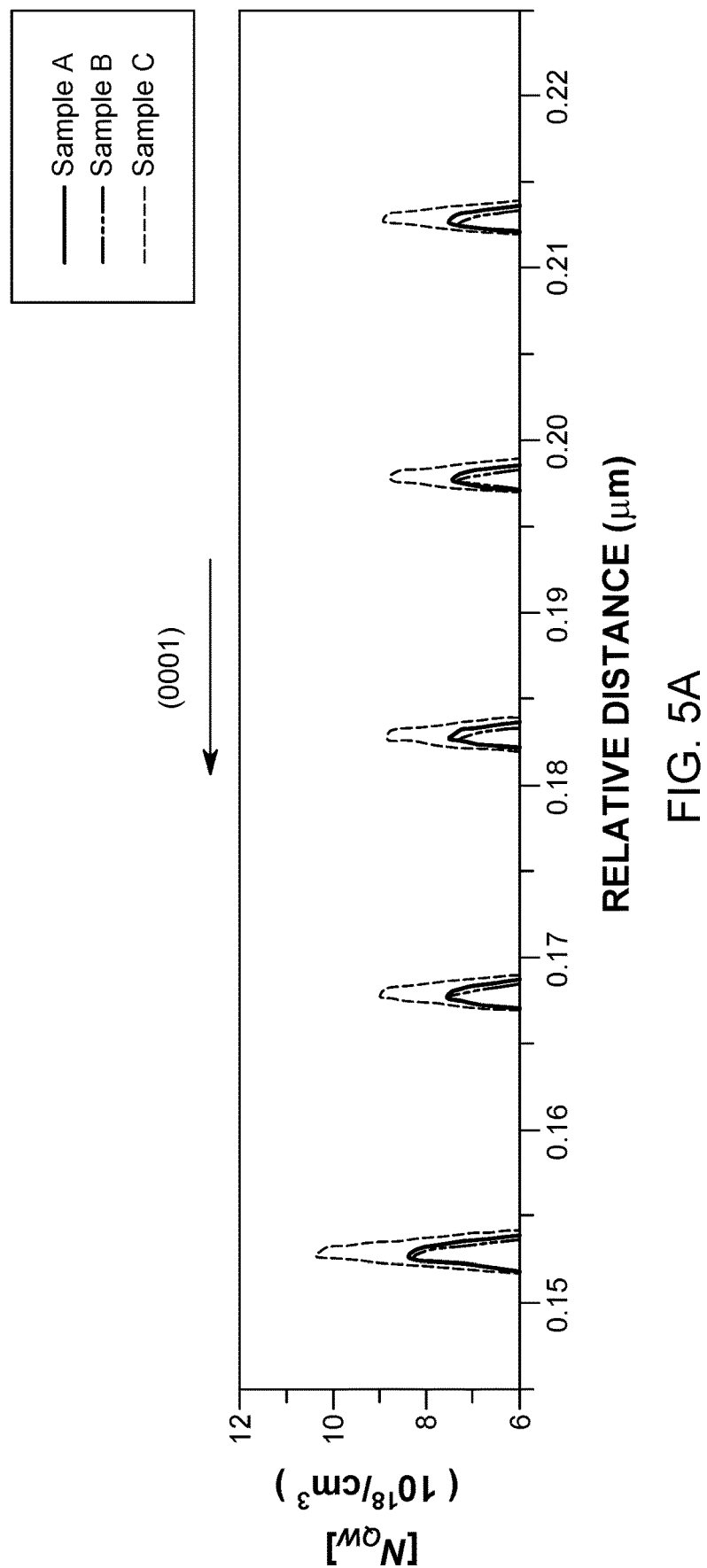
FIGS. 5A-5C are graphs of the electron concentration, hole concentration, and radiative recombination rate, respectively, of three different light emitting diodes according to embodiments.
Figure 5B:
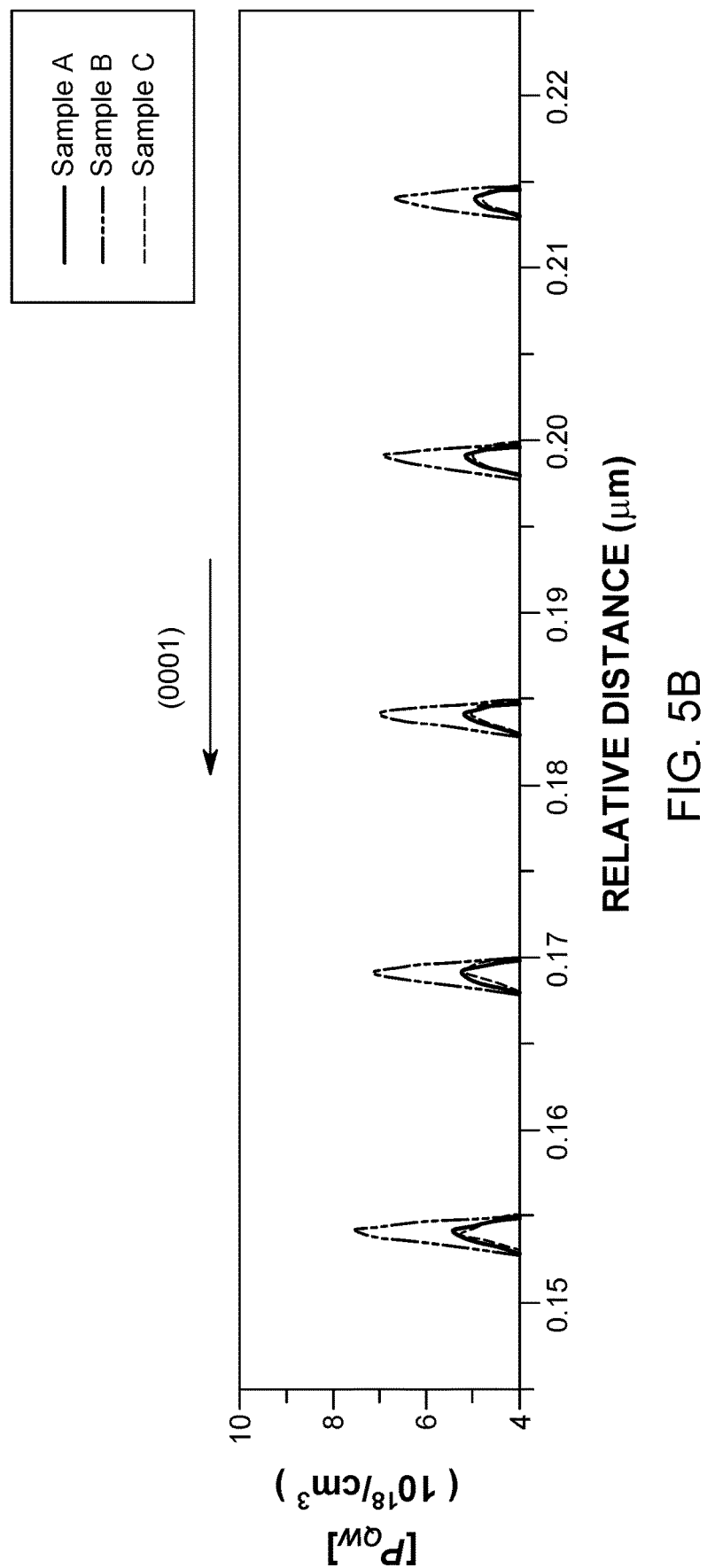
Figure 5C:
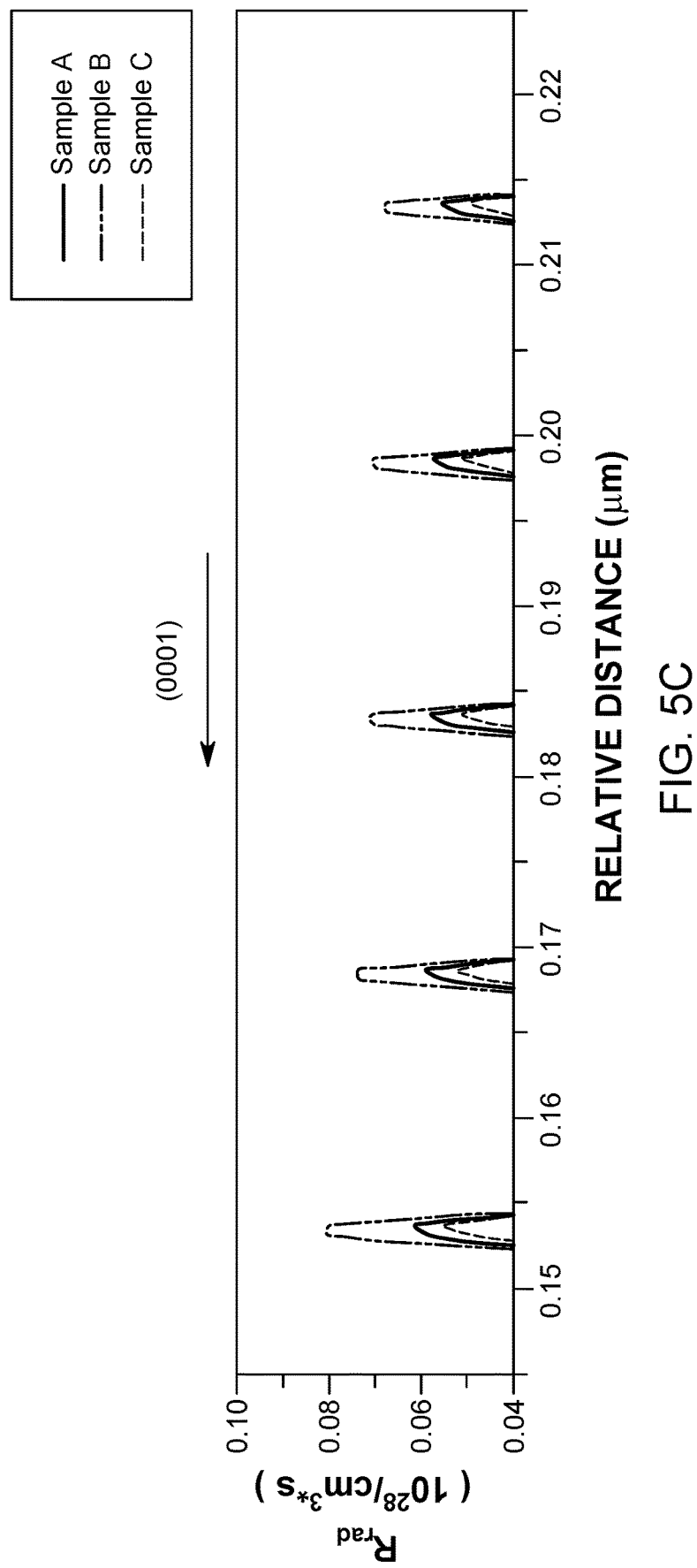

FIG. 5A-5C illustrate electron concentration [$N_{QW}$] and hole concentration [$P_{QW}$] in the quantum wells from the band diagram of FIGS. 4A-4C. Overall, the electron concentration [$N_{QW}$] was larger than the hole concentration [$P_{QW}$], which is mainly due to the lower activation energy of electrons than holes. Specifically, Sample C had the highest average electron concentration [$N_{QW}$], Sample B had the highest average hole concentration [$P_{QW}$], and Sample A exhibited intermediate behavior. For electrons, the higher electron concentration [$N_{QW}$] in Sample C was attributed to the flatter quantum barrier conduction band, which is in favor of the electron injection in quantum wells. For Samples A and B, although Sample B has steeper quantum barrier conduction band, electrons can still overcome it due to large mobility, eventually causing the electron concentration [$N_{QW}$] of Sample B to be just slightly reduced from that of Sample A. A further discussion regarding the relationship between the steeper quantum barrier conduction band and the electron concentration [$N_{QW}$] is presented below in connection with FIG. 7A. For holes, on the other hand, the highest hole concentration [$P_{QW}$] of Sample B is due to flatter quantum barriers and thus lower effective transport barrier. At the same time, the slightly lower hole concentration [$P_{QW}$] in Sample C than that of Sample A can be explained by the lower electron blocking layer barrier of Sample C being compensated by the steeper quantum barrier and thus higher transport barrier.

Figure 6:
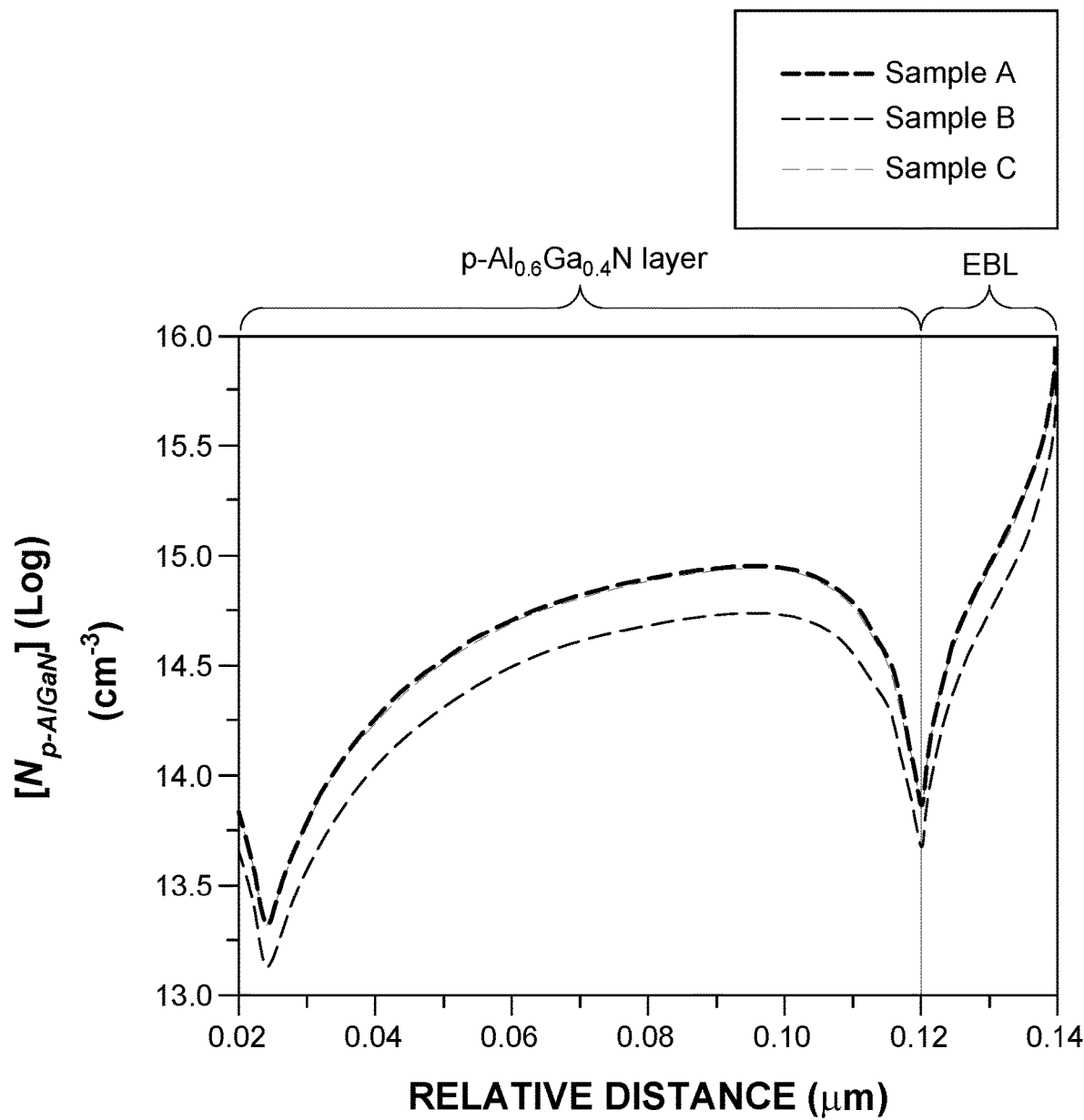
FIG. 6 is a graph of the electron concentration in the p-$Al_{0.6}Ga_{0.4}N$ hole-injection layer of three different light emitting diodes according to embodiments.

As will be appreciated from FIGS. 5A and 5B, the comparisons of the electron concentration [$N_{QW}$] and the hole concentration [$P_{QW}$] between Samples A, B, and C indicate that the slope of the quantum barrier can play a profound role in the carrier concentration in the active region. Moreover, it is essential to understand the electron containing capability of the active regions with different quantum barrier grading schemes. FIG. 6 illustrates the electron concentration in the p-$Al_{0.6}Ga_{0.4}N$ hole-injection layer [$N_{p-AlGaN}$] of Samples A, B, and C as the indicator of the electron overflow. Interestingly, Sample B exhibited lower electron concentration [$N_{p-AlGaN}$] compared to Samples A and C despite the fact that $E_c$ at its electron blocking layer (188 meV) is much lower than those of Samples A and C. The lower electron concentration [$N_{p-AlGaN}$] unambiguously demonstrates the electron containing ability of the active region of Sample B due to the quantum barrier increasing-aluminum-composition grading and the resulting higher quantum barrier conduction slope which makes it more difficult for electrons to transport to the p-type region.

FIG. 5C illustrates the radiative recombination rate $R_{rad}$ in the quantum wells of Samples A, B, and C. For Samples A, the hole concentration [$P_{QW}$] is significantly lower than the electron concentration [$N_{QW}$], but Sample C exhibits the largest imbalance. As an electron-hole pair is required for radiative recombination, the lower hole concentration [$P_{QW}$] indicates that the hole concentration [$P_{QW}$] dominates the radiative recombination, leading to a lower radiative recombination rate $R_{rad}$ for Sample A compared with Sample B. For Sample C, the hole concentration $[P_{QW}]$ is the lowest, leading to the lowest radiative recombination rate $R_{rad}$. For Sample B, the hole concentration $[P_{QW}]$ still dominates the radiative recombination but it is much higher and closer to the electron concentration $[N_{QW}]$. Accordingly, Sample B exhibits the highest radiative recombination rate $R_{rad}$, as reflected in FIG. 5C.

Figure 7A:
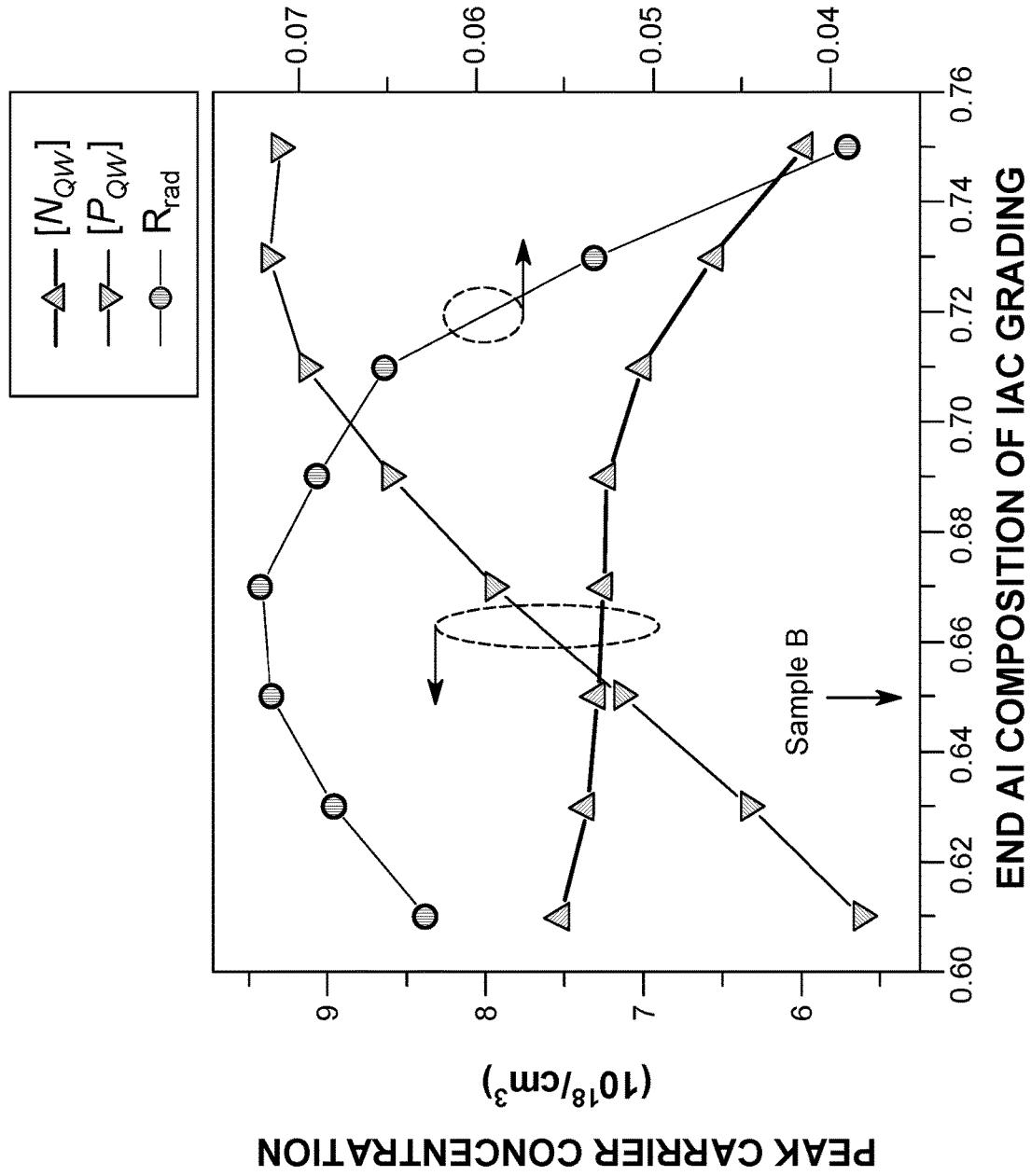
FIG. 7A illustrates the peak carrier concentration and peak radiative recombination rates in the middle of the quantum well of the active region versus the end aluminum composition of the increasing-aluminum-composition grading.

As the quantum barrier increasing-aluminum-composition grading can lead to the electron-containing capability and the higher radiative recombination rate $R_{rad}$ as shown by Sample B, it is important to investigate the carrier concentrations and radiative recombination rate $R_{rad}$ amid a wider increasing-aluminum-composition grading range for optimum configuration. Thus, the ending aluminum composition of the increasing-aluminum-composition grading was varied from 0.61 to 0.75 with steps of 0.02, while keeping the starting aluminum composition (0.60) and the quantum barrier thickness (12 nm) the same. The peak electron and hole concentrations and radiative recombination rates in the middle quantum well of the active region are illustrated in FIG. 7A. The effects of the increasing-aluminum-composition grading (Sample B) are two-fold as compared with the fixed-composition quantum barrier (Sample A). The quantum barrier valence and conduction bands become flatter and steeper, respectively. It will be appreciated that the effects are proportional to the increasing-aluminum-composition grading range because the quantum barrier thickness remains the same. In FIG. 7A, the electron concentration $[N_{QW}]$ reduces slowly with the ending aluminum compositions of 0.61-0.71, which reflects the electron containing capability, albeit the reducing rate is small because the large electron mobility can compensate for the increase of the quantum barrier valence band slope. However, the decrease of $[N_{QW}]$ accelerates when the ending composition is larger than 0.71, where the quantum barrier conduction band becomes too steep for electron transport, which means there is a greater electron containing capability. Hole concentration $[P_{QW}]$ increases quickly in a linear manner as the quantum barrier valence band flattens before saturating at higher ending compositions above 0.71, demonstrating that the increasing-aluminum-composition grading can greatly facilitate hole transport and injection.

Figure 7B:
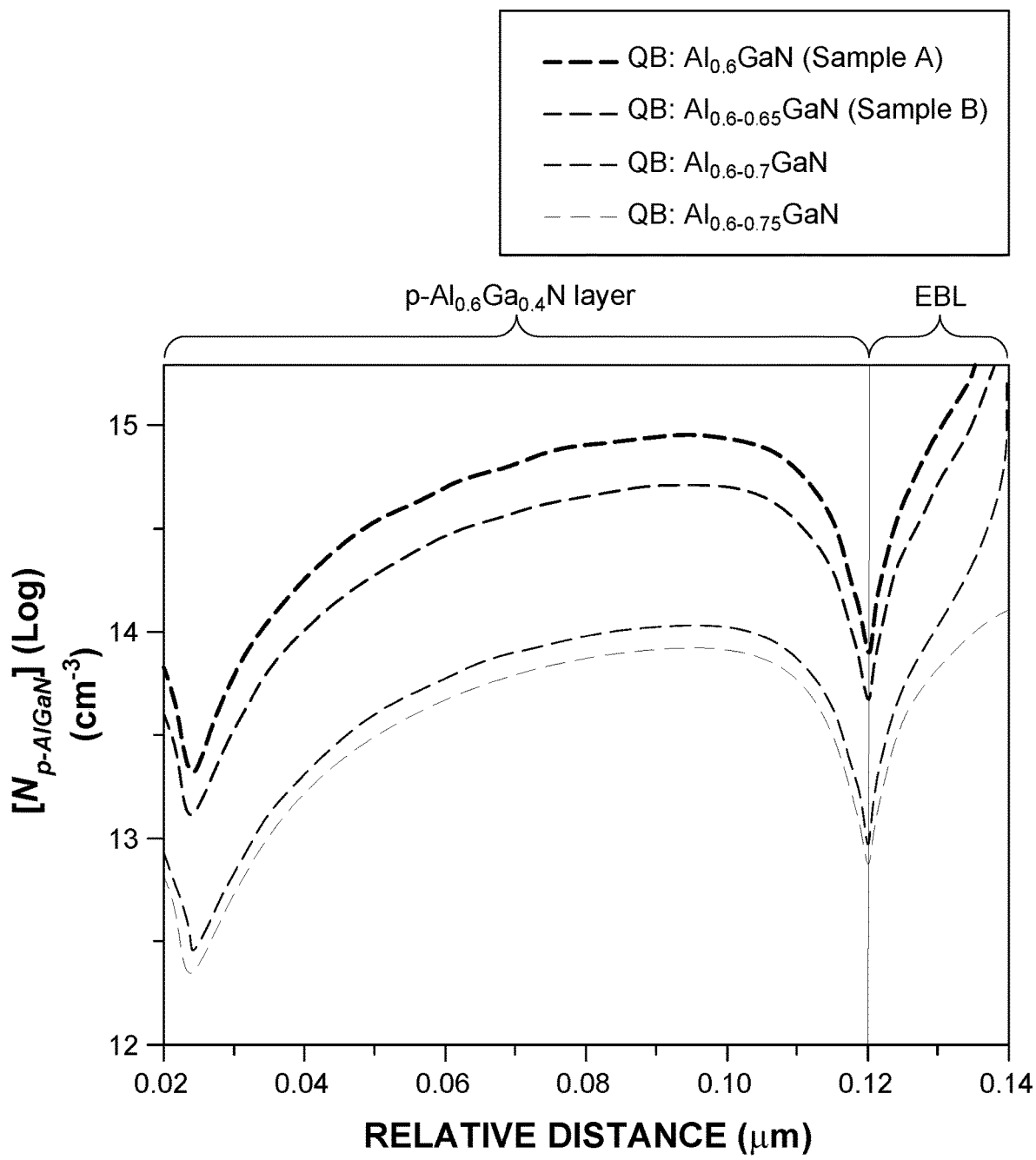
FIG. 7B is a graph illustrating the electron concentration in the p-$Al_{0.6}Ga_{0.4}N$ hole-injection layer of three increasing-aluminum-composition grading according to embodiments.

FIG. 7B illustrates the overflown electron concentration $[N_{p\text{-}AlGaN}]$ in the p-type $Al_{0.6}Ga_{0.4}N$ hole-injection layer with four different ending compositions of increasing-aluminum-concentration grading: 0.60 (i.e., no grading, Sample A), 0.65 (i.e., Sample B), 0.70, and 0.75. The overflown electron concentration $[N_{p\text{-}AlGaN}]$ reduces significantly by more than one-order-of-magnitude when the ending composition increases from 0.60 to 0.70, which indicates greatly-strengthened electron containing capability with steeper quantum barrier conduction band due to the increasing-aluminum-composition grading. Also, it is notable that the overflown electron concentration $[N_{p\text{-}AlGaN}]$ is not significantly reduced when the ending composition increased from 0.70 to 0.75, which suggests that the two grading ranges have similar electron containing capability. Returning to FIG. 7A, $R_{rad}$ first increases and peaks at the ending composition of 0.67, which coincides with both high electron concentration $[N_{QW}]$ and hole concentration $[P_{QW}]$ before dropping.

Figure 8:
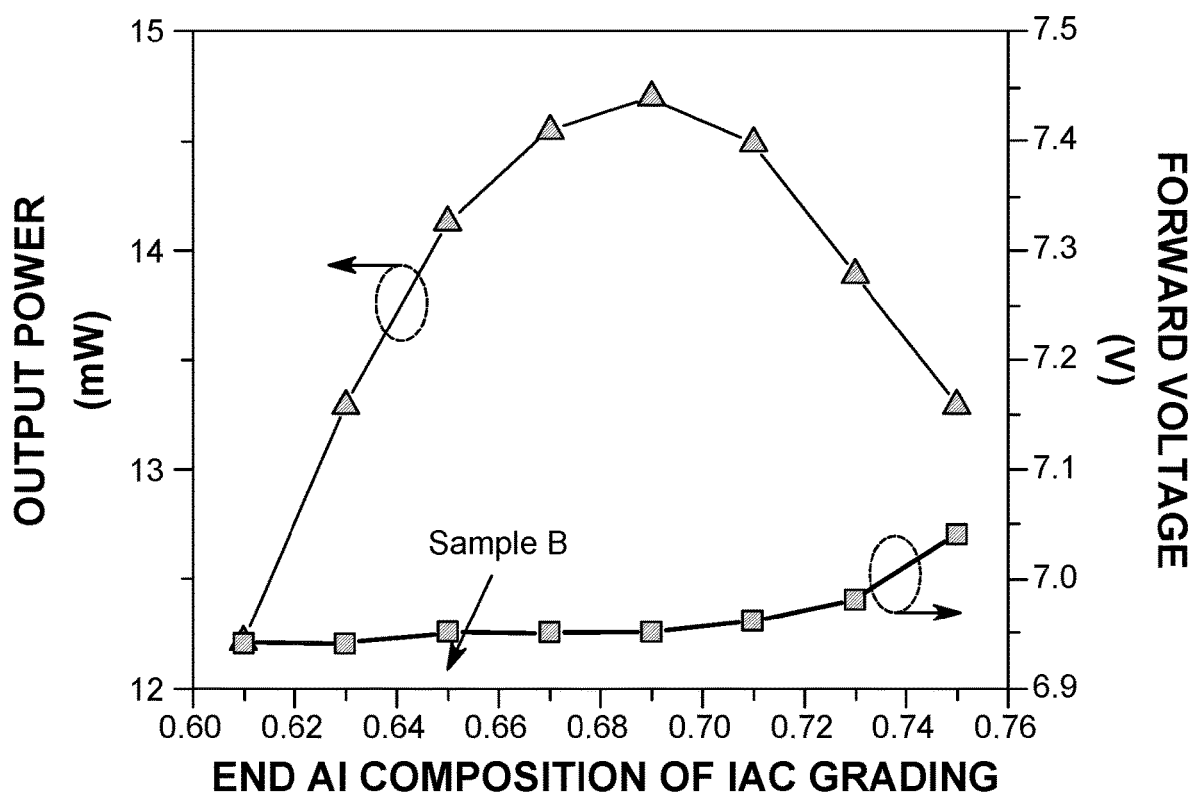
FIG. 8 is a graph of the output power and forward voltage as a function of the end aluminum composition of increasing-aluminum-composition grading according to embodiments.

FIG. 8 illustrates the forward voltage and output power of the deep ultraviolet light emitting diodes at 90 mA as a function of the ending composition of the increasing-aluminum-composition grading. With a higher ending aluminum composition, and thus enhanced electron containing capability, the forward voltage barely increases. This is important and meaningful for the pursuit of high wall plug efficiency. The change trend of the output power is consistent with that of $R_{rad}$, which peaks at the ending composition of 0.69. The slight difference in the end compositions between the peaks of $R_{rad}$ (0.67) of FIG. 7A and the output power (0.69) of FIG. 8 is caused by the fact that $R_{rad}$ is extracted from the middle quantum well, while the output power integrates the emission from the entire active region of the light emitting diode.

The performance of a light emitting diode without an electron blocking layer (i.e., the structure illustrated in FIG. 1A) was also evaluated. Specifically, one light emitting diode (hereinafter "Sample D") was modified from Sample A by removing the electron blocking layer and using a 20-nm thicker p-$Al_{0.6}Ga_{0.4}N$ hole-injection layer (120 nm) to compensate the removal of the 20 nm electron blocking layer. A second light emitting diode (hereinafter "Sample E") has the same structure as Sample D except that increasing-aluminum-composition grading was applied to quantum barriers, starting with an aluminum composition of 0.60 and ending with an aluminum composition of 0.70.

Figure 9A:
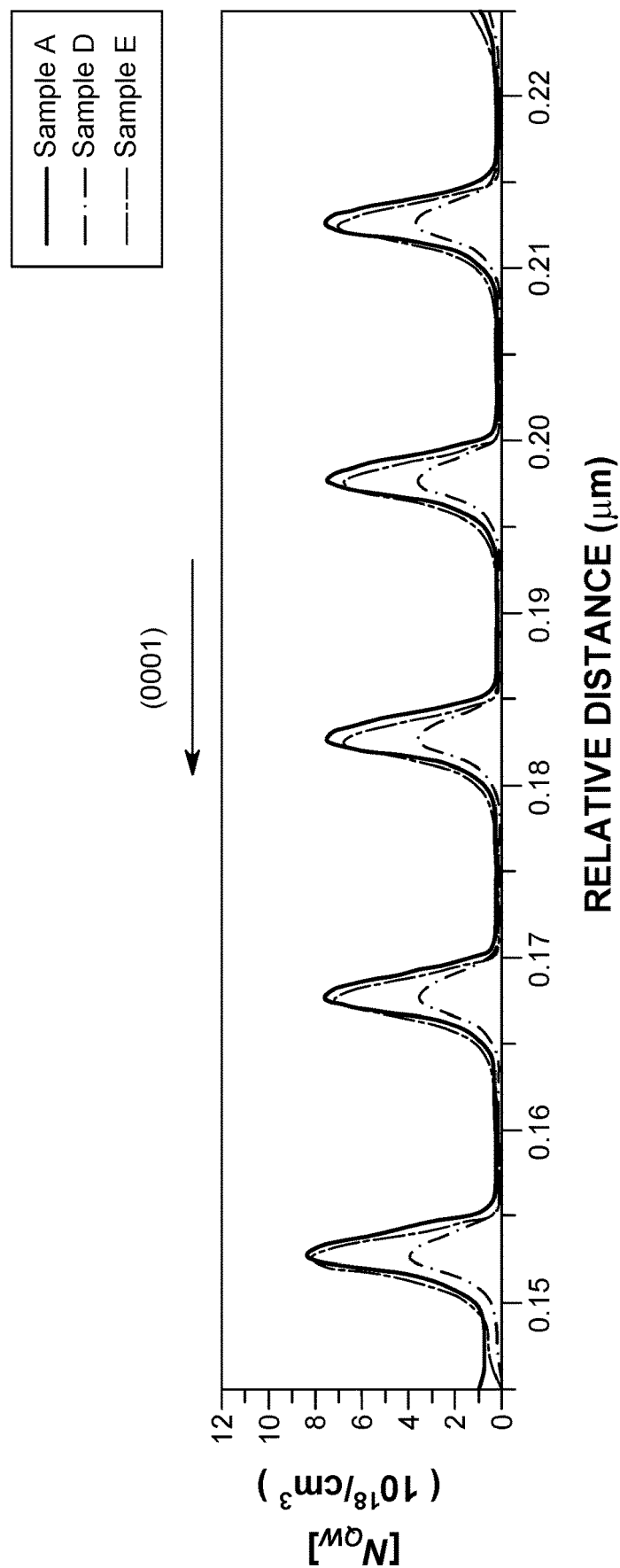
FIGS. 9A-9C are graphs of the electron concentration, hole concentration, and radiative recombination rate, respectively, of three different light emitting diodes according to embodiments.
Figure 9B:
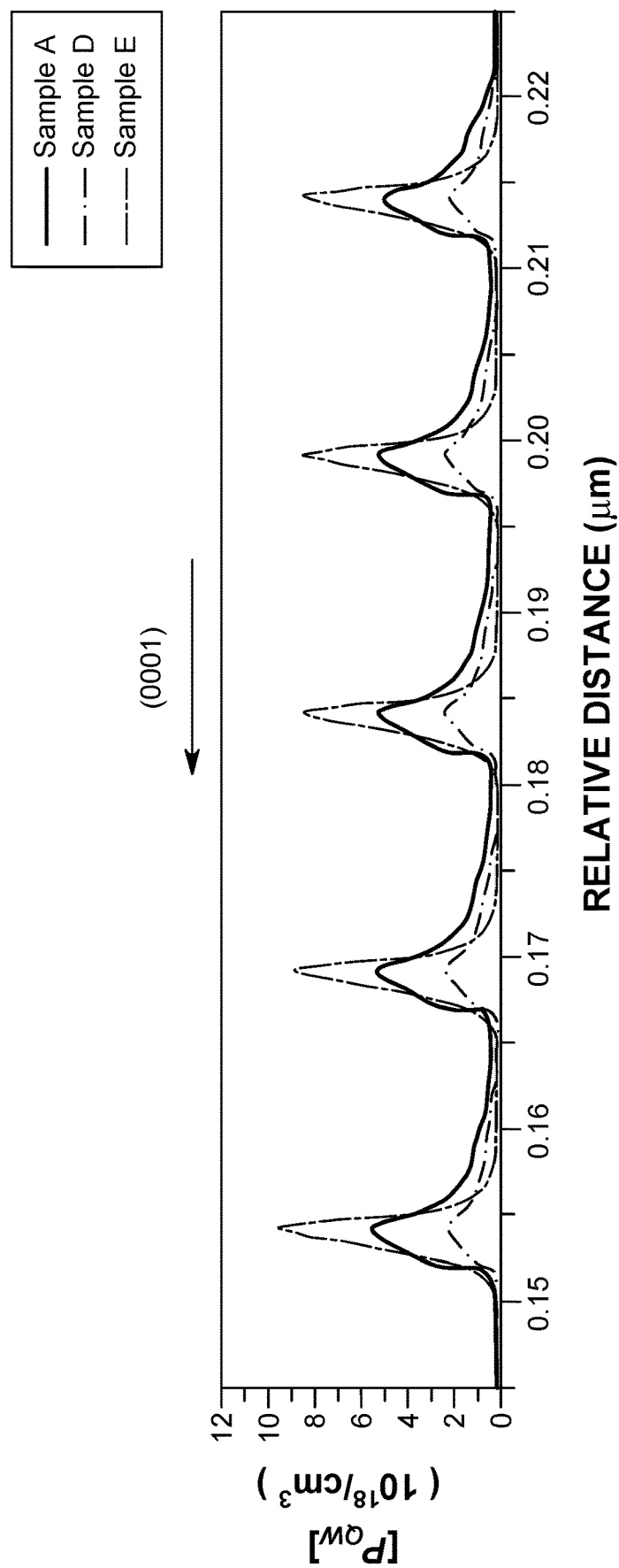
Figure 9C:
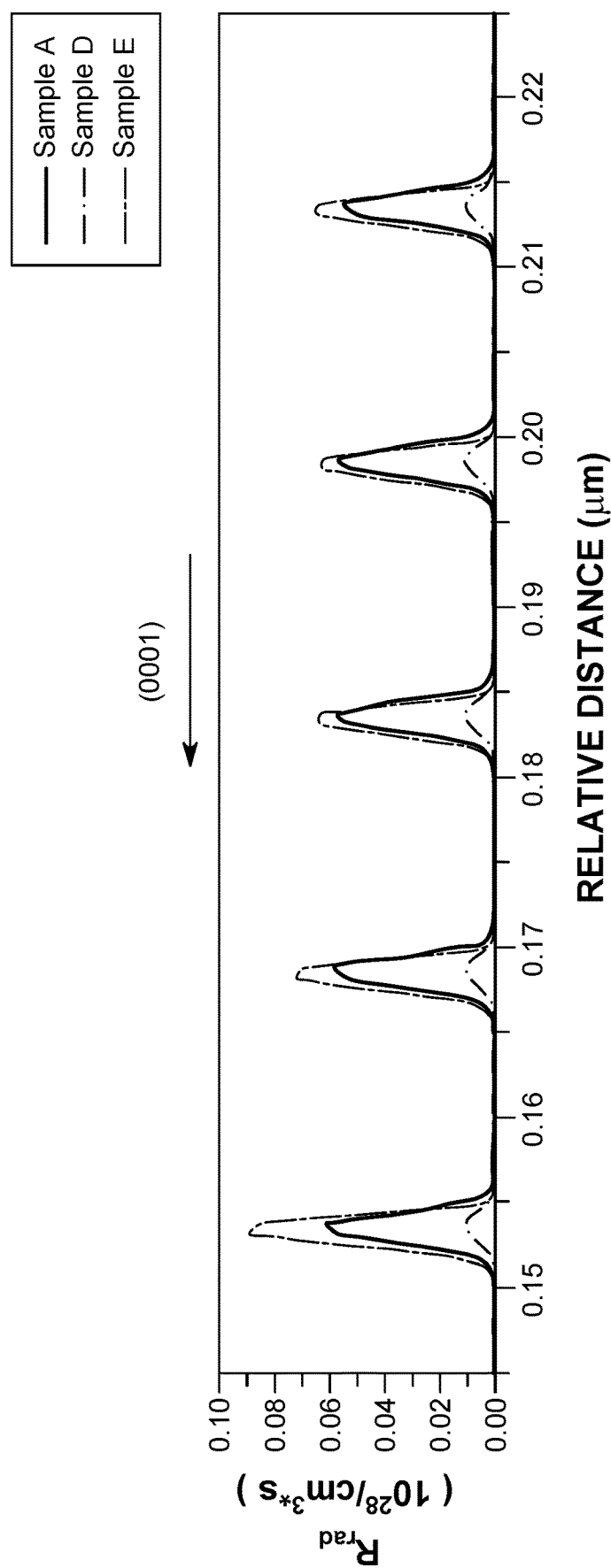

FIGS. 9A and 9B respectively illustrate the electron concentration $[N_{QW}]$ and the hole concentration $[P_{QW}]$ in the quantum wells of Samples D and E, with the addition of Sample A as reference. On one hand, hole concentration $[P_{QW}]$ of Sample E is higher than that of Sample A, due to the IAC grading, resembling the situation of Sample B. On the other hand, electron concentration $[N_{QW}]$ of Sample E is slightly lower than that of Sample A, which is consistent with the observation of FIG. 5(a) due to steeper quantum barrier valence band. Electron concentration $[N_{QW}]$ and hole concentration $[P_{QW}]$ of Sample D are significantly lower than those of Sample A, as the removal of the electron blocking layer leads to severe electron leakage into the p-type region that not only reduces electron concentration $[N_{QW}]$ but also compromises hole injection into the quantum wells. Consequently, Sample D exhibits the lowest radiative recombination rate $R_{rad}$, as illustrated in FIG. 9C. Moreover, the radiative recombination rate $R_{rad}$ of Sample E is higher than that of Sample A due to higher hole concentration $[P_{QW}]$, indicating that the electron blocking layer-free deep ultraviolet light emitting diode can have $R_{rad}$ higher than the conventional deep ultraviolet light emitting diode with the fixed-composition AlGaN electron blocking layer.

Figure 10A:
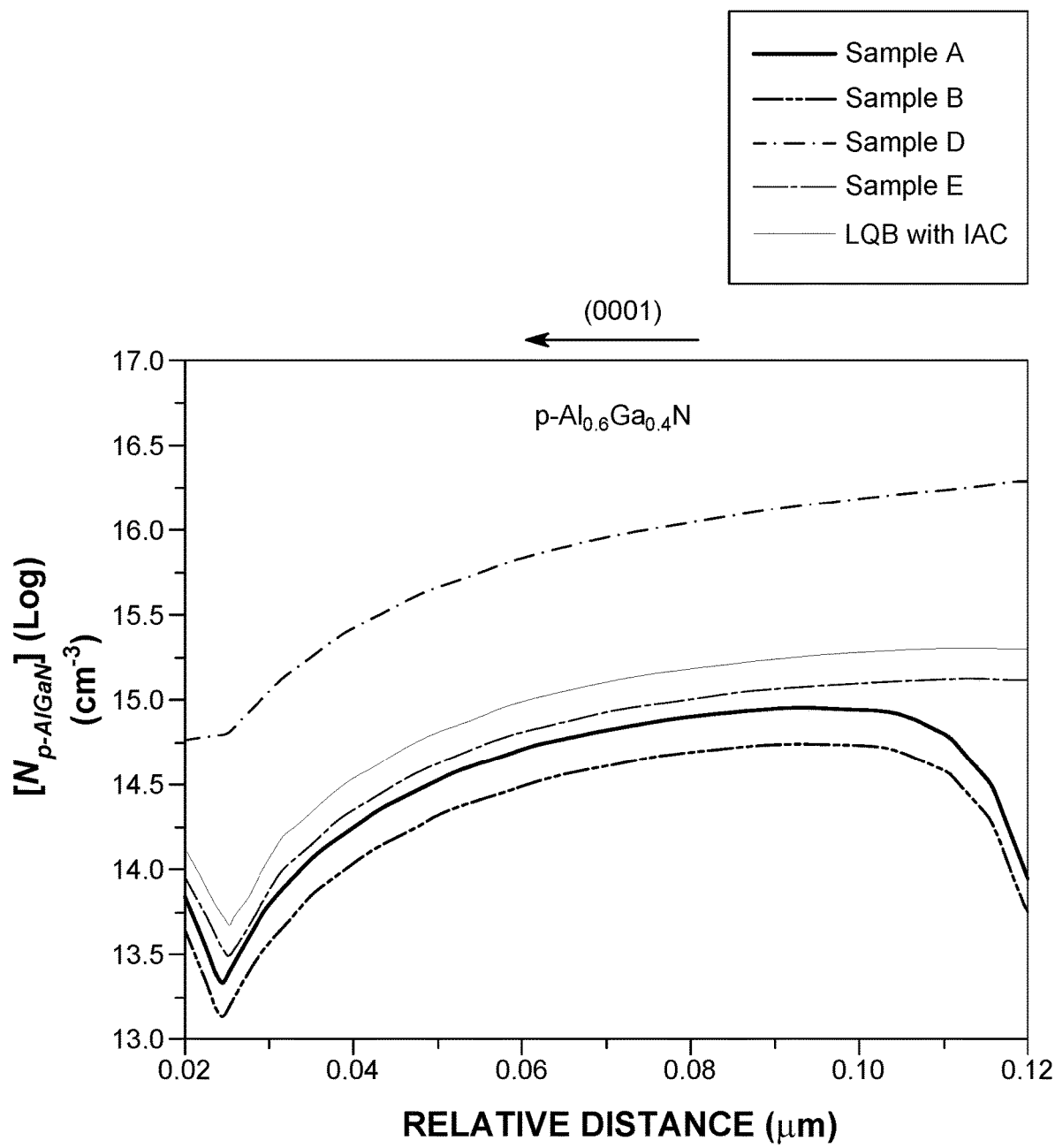
FIG. 10A is a graph of the electron concentration in a p-$Al_{0.6}Ga_{0.4}N$ layer of three different light emitting diodes according to embodiments.

The graph in FIG. 10A provides additional evidence for the excellent electron containing capability of the quantum barrier increasing-aluminum-content grading. As illustrated, the overflown electron concentration in the p-$Al_{0.6}Ga_{0.4}N$ layer hole-blocking layer $[N_{p\text{-}AlGaN}]$ of Sample E without the electron blocking layer is similar to that of Sample A with the electron blocking layer in the center of the p-$Al_{0.6}Ga_{0.4}N$ layer, both being close to $1\times10^{15}/cm^{-3}$. Not surprisingly, Sample D had much larger overflown electron concentration $[N_{p\text{-}AlGaN}]$ due to the lack of the electron blocking layer versus Sample A.

Figure 10B:
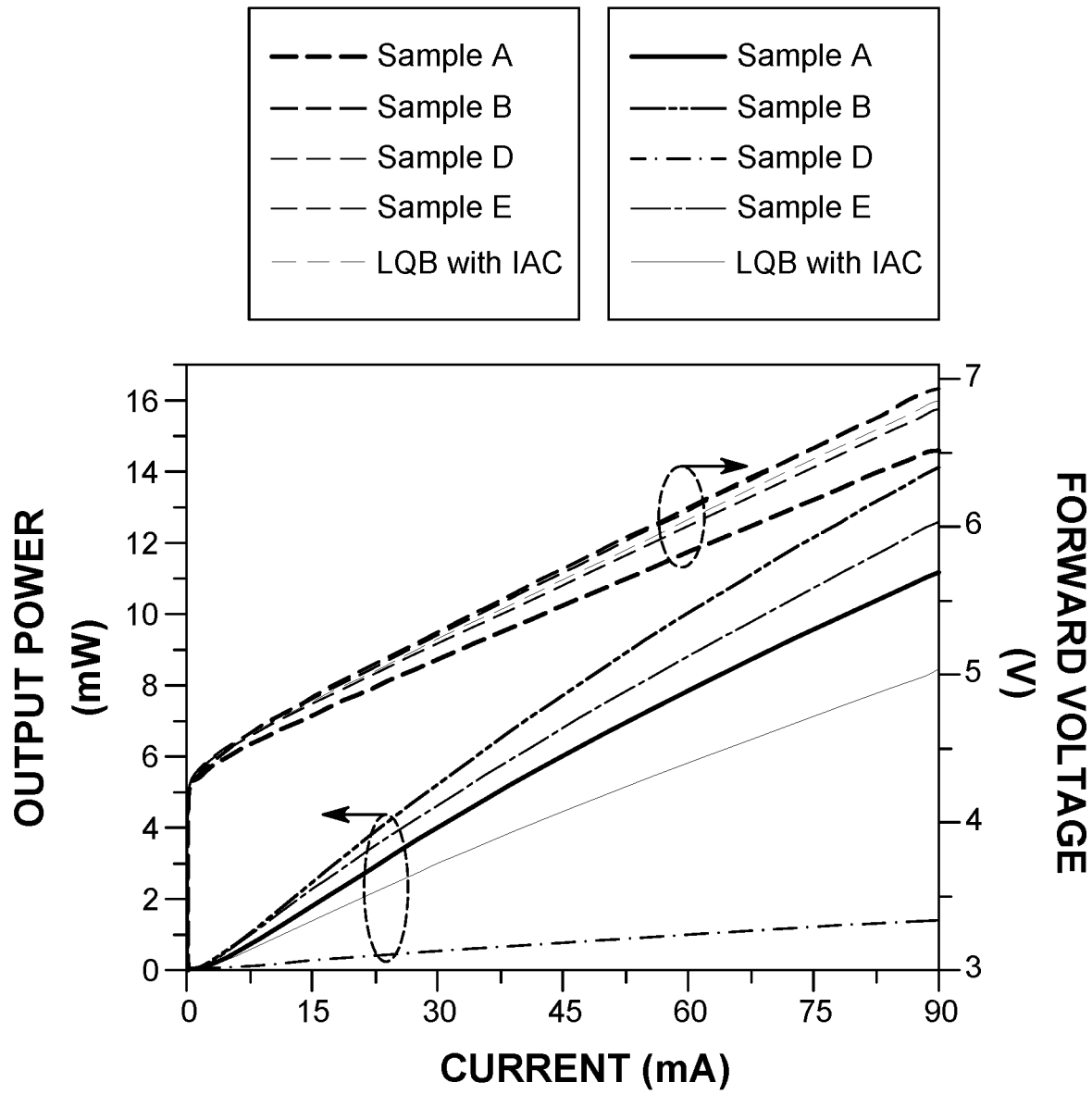
FIG. 10B is a graph of the output power and forward voltage as a function of current for four different light emitting diodes according to embodiments.

FIG. 10B is also consistent with FIG. 9C. The output power of Sample D without the electron blocking layer is very low because the overflow of electrons into the p-type region is severe, causing poor injection for both electrons and holes. The high electron leakage can be greatly alleviated by adding an electron blocking layer such as in Sample A, reaffirming the importance of the electron blocking layer in conventional III-nitride deep ultraviolet light emitting diodes. More importantly, FIG. 10B indicates that higher (13.5% higher at 90 mA) output power than that of the conventional deep ultraviolet light emitting diode (Sample A) can be achieved by utilizing the electron containing capability of the increasing-aluminum-composition graded quantum barriers even without the electron blocking layer (Sample E). Moreover, the forward voltage of Sample E is slightly lower (1.2% lower at 90 mA) than that of Sample A, while that of Sample D is the lowest due to the removal of the electron blocking layer.

With the structures of Samples A and E, one could argue that the results are not unexpected because the last quantum barrier (LQB) reaches Al composition of 0.7 after grading, which is the same Al composition as the electron blocking layer of Sample A. To confirm, another sample was evaluated, the sample was based on Sample E except that the increasing-aluminum-composition grading only applies to the last quantum barrier (0.6→0.7) and the other four quantum barriers have a constant Al composition of 0.6. As shown in FIGS. 10A and 10B, this sample exhibits worse electron containing capability and much lower output power than Samples A and E, thereby suggesting that the electron blocking layer design requires the application of the increasing-aluminum-composition grading to all quantum barriers to realize optimized electron containing and hole injection. Nevertheless, the deep ultraviolet light emitting diode without the p-type electron blocking layer is feasible, which could avoid the issues related to the electron blocking layer especially p-type doping, hole injection, and epitaxial complexity.

To eliminate issues related to the p-type Al-rich electron blocking layer including p-doping difficulty, valence band barrier, and epitaxial complexity, an electron blocking layer-free AlGaN deep ultraviolet light emitting diode has been described, which shifts the paradigm from electron blocking in the p-type region to electron containing in the active region. By employing the linearly-graded-composition AlGaN quantum barriers, the carrier concentration in the quantum wells and overflown electron concentration in the p-type region can be significantly changed due to variation of the slope of the quantum barrier conduction and valence bands and thus carrier transport barrier. This can further result in modification of the radiative recombination rate. Specifically, when grading the Al composition of the AlGaN quantum barriers from low to high along the growth direction, i.e., the c-axis, the active region exhibits the remarkable electron containing capability that reduces the electron overflow. In addition, the hole injection and thus hole concentration increases in the quantum well due to flattering of the quantum barrier valence band and thus lower hole transport barrier, that can enhance the radiative recombination rate.

For two deep ultraviolet light emitting diodes emitting at 270 nm, the electron blocking layer-free one with the graded $Al_xGa_{1-x}N$ (x=0.60→0.70) quantum barriers exhibits similar degree of electron overflow (~$1\times10^{15}$/cm$^3$) and higher hole concentration in the quantum wells simultaneously, leading to 13.5% higher output power as compared with the other conventional one with the p-type electron blocking layer. As the disclosed quantum barrier grading is straightforward and effective, it can be easily adopted by the deep ultraviolet light emitting diode and laser community to incorporate the electron containing capability in the device design to replace or complement the p-type electron blocking layer. Further, although the quantum barrier grading has been described in connection with deep ultraviolet light emitting diodes, the quantum barrier grading can be employed with III-nitride light emitters having other spectral ranges.

The grading rate of the 10% compositional change in a 12 nm AlGaN layer (Sample E) can be realized by mainstream epitaxial technologies such as metal organic chemical vapor deposition (MOCVD) and molecular beam epitaxy (MBE). Because the compositional change is relatively small and no intentional doping is needed amid the quantum barrier growth, for instance, the grading can be achieved by varying Al/III molar ratio in a MOCVD process. The discussion above demonstrates that a deep ultraviolet light emitting diode without an electron blocking layer can achieve slightly better output power (i.e., wall plug efficiency) performance, as opposed to the conventional deep ultraviolet light emitting diode. However, in practice one can optionally combine both the quantum barrier increasing-aluminum-grading and the electron blocking layer to obtain even less electron spill-over (see FIG. 10A) and higher output power (see FIG. 10B) as shown by Sample B. It should be noted that the inclusion of the electron blocking layer will inevitably increase the forward voltage as exhibited by Sample B in FIG. 10B as well as epitaxial and doping difficulty, especially when the goal is to make shorter-wavelength deep ultraviolet light emitting diode. Therefore, the skilled artisan can make the proper choice and compromise amid the device design processes.

The disclosed embodiments provide a light emitting diode with a multiple quantum well having at least one graded quantum barrier layer. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

"Valence Band Effective-Mass Hamiltonians for the Group-III Nitrides from Quasiparticle Self-Consistent GW Band Structures" by Punya et al., Phys. Rev. B, vol. 85, 2012, Art. No. 195147.

What is claimed is:
1. A light-emitting diode, comprising:
a substrate;
an n-type aluminum nitride layer formed on the substrate;
a multiple quantum well formed on the n-type aluminum nitride layer; and
a p-type aluminum nitride hole-injection layer having a constant composition and formed adjacent to the multiple quantum well,
wherein the multiple quantum well comprises, a first aluminum nitride quantum well layer having a constant composition and surrounded by first and second aluminum nitride quantum barrier layers, and a second aluminum nitride quantum well layer having a constant composition and surrounded by the second aluminum nitride quantum barrier layer and a third aluminum nitride quantum barrier layer, wherein at least one of the first, second, and third aluminum nitride quantum barrier layers is $Al_xGa_{1-x}N$ and has a graded aluminum composition, wherein there is no electron blocking layer between the multiple quantum well and the p-type aluminum nitride hole-injection layer, wherein the first aluminum nitride quantum barrier layer is adjacent to the n-type aluminum nitride layer and the third aluminum nitride quantum barrier layer is adjacent to the p-type aluminum nitride hole-injection layer, and wherein x increases from 0.60 to 0.70, from a portion of the at least one of the first, second, and third aluminum nitride quantum barrier layers closest to the substrate to a portion of the at least one of the first, second, and third aluminum nitride quantum barrier layers furthest from the substrate.

2. The light emitting diode of claim 1, wherein the p-type aluminum nitride hole-injection layer is directly adjacent to the multiple quantum well and the light emitting diode does not include an electron blocking layer.

3. The light emitting diode of claim 1, further comprising:
a p-type nitride contact layer arranged on the p-type aluminum nitride hole-injection layer;
a first electrode arranged on the p-type nitride contact layer; and
a second electrode arranged on the n-type aluminum nitride layer.

4. The light emitting diode of claim 1, wherein the aluminum composition of the at least one of the first, second, and third aluminum nitride quantum barrier layers is linearly graded.

5. The light emitting diode of claim 1, wherein the aluminum composition of the at least one of the first, second, and third aluminum nitride quantum barrier layers is non-linearly graded.

6. The light emitting diode of claim 1, wherein the aluminum composition of the at least one of the first, second, and third nitride quantum barrier layers has a change in grading between two and ten percent.

7. The light emitting diode of claim 1, wherein the n-type aluminum nitride layer, first and second aluminum nitride quantum well layers, first, second, and third aluminum nitride quantum barrier layers, and p-type aluminum nitride hole-injection layer further comprise gallium.

8. The light emitting diode of claim 7, wherein an amount of aluminum and gallium in the n-type aluminum nitride layer is the same as an amount of aluminum and gallium in a portion of the first aluminum nitride quantum well that is closest to the n-type aluminum nitride layer.

9. A method for forming light-emitting diode, the method comprising:
forming an n-type aluminum nitride layer on a substrate;
forming a multiple quantum well on the n-type aluminum nitride layer by
forming a first aluminum nitride quantum barrier layer on the n-type aluminum nitride layer;
forming a first aluminum nitride quantum well layer having a constant composition on the first aluminum nitride quantum barrier;
forming a second aluminum nitride quantum barrier layer on the first aluminum nitride quantum well layer;
forming a second aluminum nitride quantum well layer having a constant composition on the second aluminum nitride quantum barrier layer; and
forming a third aluminum nitride quantum barrier layer on the second aluminum nitride quantum well layer, wherein at least one of the first, second, and third aluminum nitride quantum barrier layers is $Al_xGa_{1-x}N$ and has a graded composition;
forming a p-type aluminum nitride hole-injection layer having a constant composition and adjacent to the multiple quantum well,
wherein there is no electron blocking layer between the multiple quantum well and the p-type aluminum nitride hole-injection layer, and
wherein x increases from 0.60 to 0.70, from a portion of the at least one of the first, second, and third aluminum nitride quantum barrier layers closest to the substrate to a portion of the at least one of the first, second, and third aluminum nitride quantum barrier layers furthest from the substrate.

10. The method of claim 9, wherein the formation of the p-type aluminum nitride hole-injection layer comprises:
forming the p-type aluminum nitride hole-injection layer directly adjacent to the multiple quantum well, wherein the light emitting diode does not include an electron blocking layer.

11. The method of claim 9, further comprising:
forming a p-type nitride contact layer on the p-type aluminum nitride hole-injection layer;
forming a first electrode on the p-type nitride contact layer; and
forming a second electrode on the n-type aluminum nitride layer.

\* \* \* \* \*